US012658220B2

(12) United States Patent　　　　(10) Patent No.:　　US 12,658,220 B2
Ueda et al.　　　　　　　　　　　　(45) Date of Patent:　　　Jun. 16, 2026

(54) MAGNETIC MEMORY

(71) Applicant: Kioxia Corporation, Tokyo (JP)

(72) Inventors: Yoshihiro Ueda, Yokohama Kanagawa (JP); Nobuyuki Umetsu, Kawasaki Kanagawa (JP); Masaki Kado, Kamakura Kanagawa (JP)

(73) Assignee: Kioxia Corporation, Tokyo (JP)

( * ) Notice:　Subject to any disclaimer, the term of this patent is extended or adjusted under 35 U.S.C. 154(b) by 129 days.

(21) Appl. No.: 18/829,968

(22) Filed:　　Sep. 10, 2024

(65)　　　　　　Prior Publication Data

US 2025/0266063 A1　　Aug. 21, 2025

(30)　　　Foreign Application Priority Data

Feb. 16, 2024　(JP) ................................. 2024-022236

(51) Int. Cl.
　　*G11C 5/08*　　　　(2006.01)
　　*H10B 61/00*　　　(2023.01)
(52) U.S. Cl.
　　CPC ............... *G11C 5/08* (2013.01); *H10B 61/22* (2023.02)
(58) Field of Classification Search
　　CPC .......... G11C 5/08; H10B 61/22; H10N 50/10
　　USPC .......................................................... 365/66
　　See application file for complete search history.

(56)　　　　　　References Cited

U.S. PATENT DOCUMENTS 11,711,925 B2　　7/2023　Tokuhira et al.
11,871,586 B2　　1/2024　Shimomura et al.

2015/0035096 A1 *　2/2015　Han ........................ H10B 61/22
　　　　　　　　　　　　　　　　　　　　257/421
2019/0206937 A1 *　7/2019　Sharma .................. H10N 50/01
2019/0207024 A1 *　7/2019　Kim ....................... H10B 61/22
2022/0076723 A1　　3/2022　Shimomura et al.
2022/0108738 A1　　4/2022　Honda et al.
2022/0293678 A1　　9/2022　Ueda et al.
2023/0180484 A1　　6/2023　Nakamura et al.

FOREIGN PATENT DOCUMENTS

JP　　　2021-141250 A　　9/2021
JP　　　2022-138916 A　　9/2022
JP　　　2023-37504 A　　3/2023

* cited by examiner

*Primary Examiner* — Fernando Hidalgo
(74) *Attorney, Agent, or Firm* — Finnegan, Henderson, Farabow, Garrett & Dunner, LLP

(57)　　　　　　　ABSTRACT

A memory includes first magnetic-members extending in a first direction and having a first and s second end portions. Second magnetic-members are provided corresponding to the first magnetic-members, and extend in the first direction from an inside of cylinders of the first magnetic-members on a side of the second end portions. Third magnetic-members are provided above the second magnetic-members corresponding to the first magnetic-members, and are electrically disconnected from the second magnetic-members. First wires extend in a second direction, are arranged in a third direction intersecting the first and the second directions, and are electrically connected to the third magnetic-members arranged in the second direction. A fourth magnetic-member is provided around the second end portions of the first magnetic-members, and is electrically disconnected from the second and third magnetic-members. Second wires are provided on a side of the first end portions of the first magnetic-members.

29 Claims, 19 Drawing Sheets

25b

26

25a

MAGNETIC MEMORY

CROSS REFERENCE TO RELATED APPLICATIONS

This application is based upon and claims the benefit of priority from the prior Japanese Patent Application No. 2024-022236, filed on Feb. 16, 2024, the entire contents of which are incorporated herein by reference.

FIELD

The embodiments of the present invention relate to a magnetic memory.

BACKGROUND

A magnetic memory has been developed that moves (shifts) a magnetic wall of a magnetic member by passing an electric current through the magnetic member. In this magnetic memory, data is written into the magnetic member by a magnetic field generated by passing an electric current through a field line. However, it is difficult for this magnetic memory to write data efficiently into the magnetic member.

DETAILED DESCRIPTION

Figure 1:
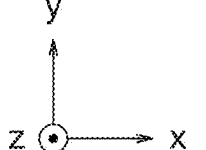
FIG. 1 is a plan view illustrating a configuration example of a magnetic memory according to a first embodiment.

In general, according to the embodiment, a magnetic memory includes a plurality of first magnetic members extending in a first direction, each of which is cylindrical and has a first end portion and a second end portion. A plurality of second magnetic members are provided corresponding to the first magnetic members, and extend in the first direction from an inside of cylinders of the first magnetic members on a side of the second end portions. A plurality of third magnetic members are provided above the second magnetic members corresponding to the first magnetic members, and are electrically disconnected from the second magnetic members. A plurality of first wires extend in a second direction intersecting the first direction, are arranged adjacent to each other in a third direction intersecting the first direction and the second direction, and are electrically connected to the third magnetic members arranged in the second direction. A fourth magnetic member is provided around the second end portions of the first magnetic members, and is electrically disconnected from the second magnetic members and the third magnetic members. A plurality of second wires are provided on a side of the first end portions of the first magnetic members. Hereinafter, devices of the present disclosure will be described with reference to the drawings.

The present invention is not limited to the embodiments. In the present specification and the drawings, elements identical to those described in the foregoing drawings are denoted by like reference characters and detailed explanations thereof are omitted as appropriate.

First Embodiment

Figure 2:
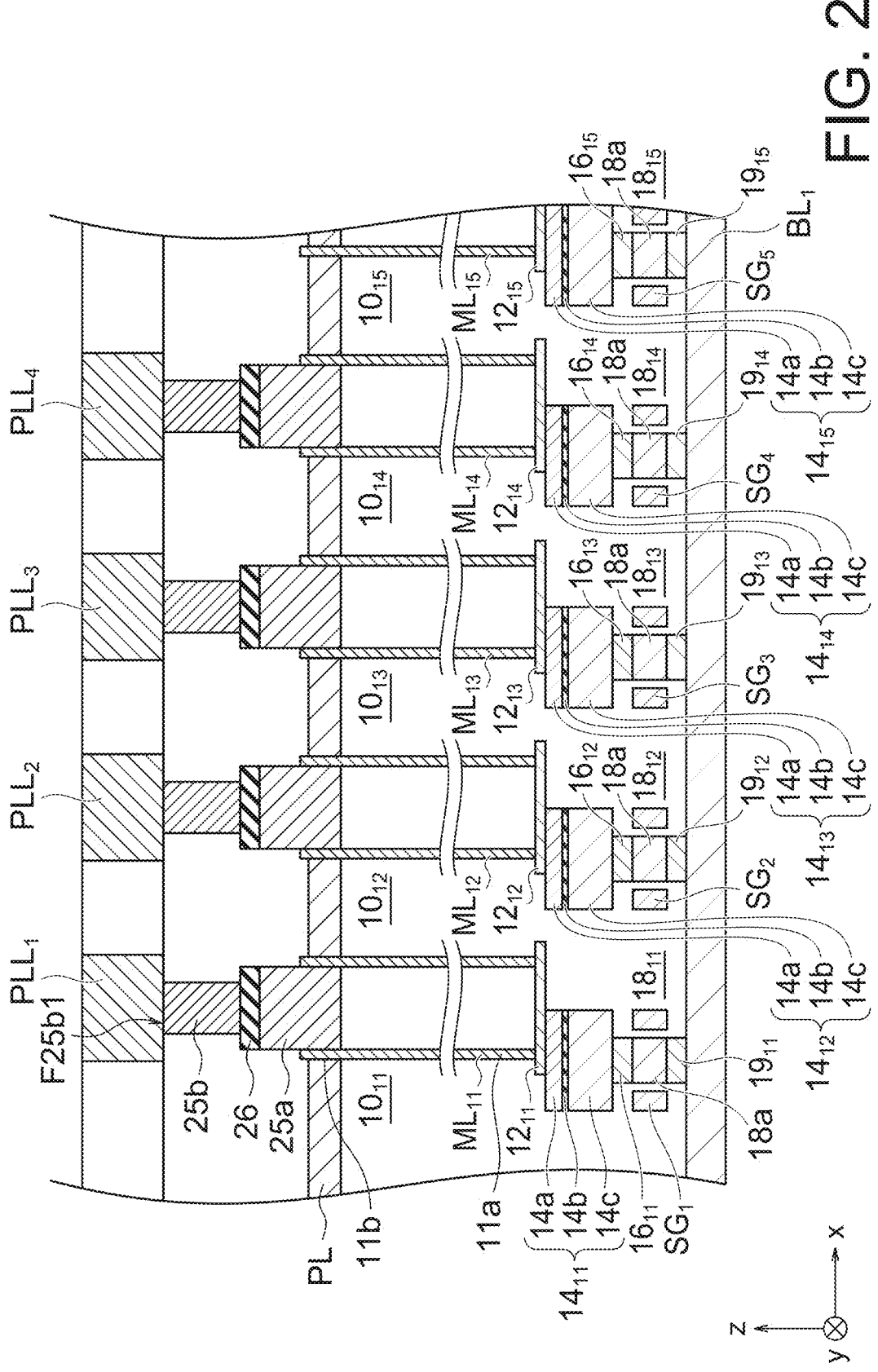
FIG. 2 is a cross-sectional view taken along a line A-A illustrated in FIG. 1.
Figure 3:
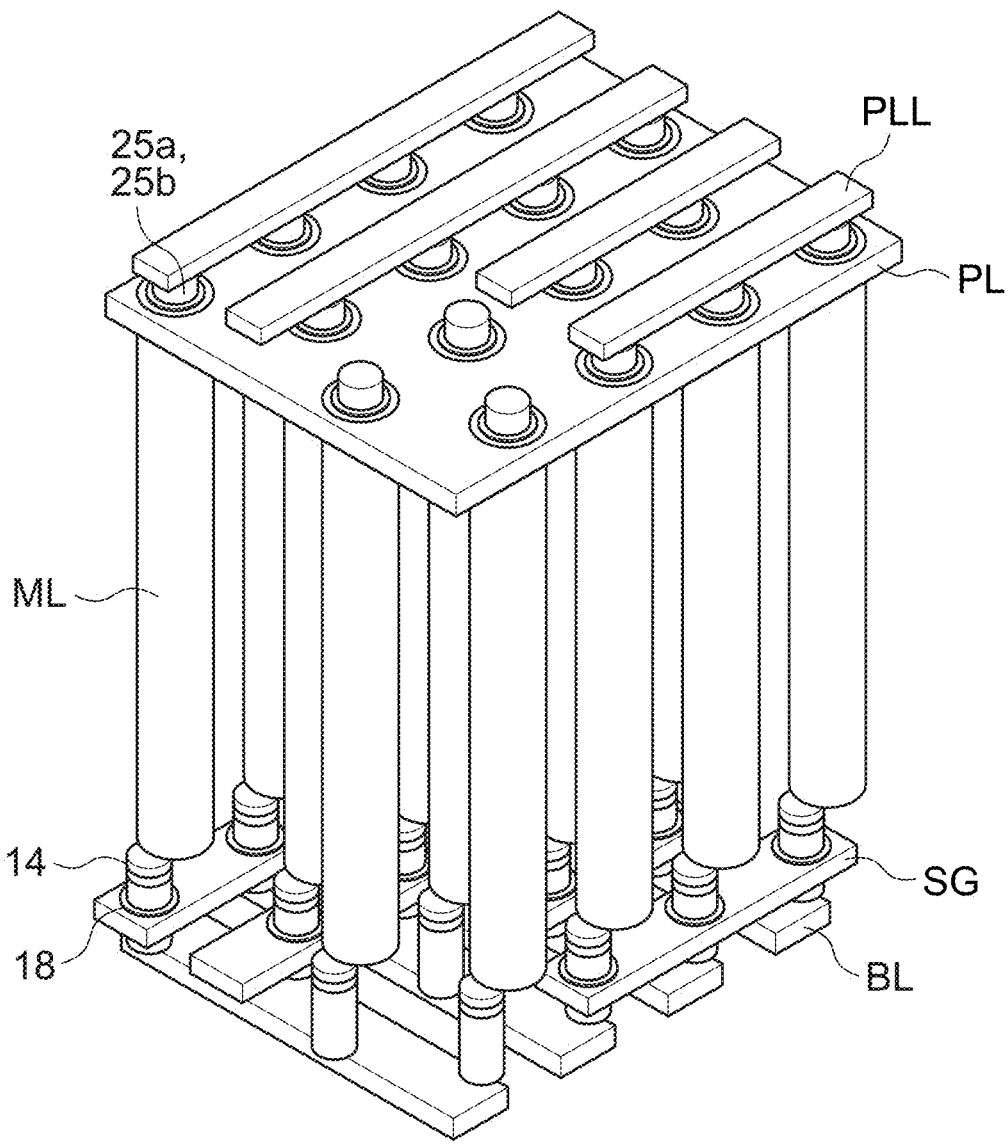
FIG. 3 is a perspective view illustrating a configuration example of the magnetic memory according to the first embodiment.

FIG. 1 is a plan view illustrating a configuration example of a magnetic memory according to a first embodiment. FIG. 2 is a cross-sectional view taken along the line A-A illustrated in FIG. 1. FIG. 3 is a perspective view illustrating a configuration example of the magnetic memory according to the first embodiment.

As illustrated in FIG. 1, the magnetic memory in the first embodiment includes memory parts $10_{ij}$ (i=1 to m, j=1 to n) arranged in m rows by n columns, where m and n are natural numbers. FIG. 1 illustrates memory parts $10_{11}$ to $10_{35}$ arranged in 3 rows by 5 columns. FIG. 3 omits illustrations of the row numbers and the column numbers.

Memory parts $10_{i1}$ to $10_{in}$ in the i-th row are arranged along a bit line $BL_i$ extending in an x direction. First end portions $11a$ are electrically connected to the bit line $BL_i$. In the present specification, the expression "A and B are electrically connected" means that A and B may be directly connected, or may be indirectly connected through a conductor. In the i-th row, the memory parts $10_{i1}$, $10_{i3}$, . . . in odd-numbered columns, and the memory parts $10_{i2}$, $10_{i4}$, . . . in even-numbered columns are arranged in a staggered pattern in a vertical direction (y direction) on the drawing. For example, the memory part $10_{i2}$ in the even-numbered column is provided between the memory part $10_{i1}$ and the memory part $10_{i3}$ in the odd-numbered columns, and is arranged to be staggered from the memory parts $10_{i1}$ and $10_{i3}$ in a-y direction. Using this arrangement enables a plurality of memory parts to be densely arranged, and be integrated.

A plurality of poles $25a$ are provided corresponding to a plurality of memory parts $10_{11}$ to $10_{mn}$. As illustrated in FIG. 2, the poles $25a$ are partially inserted in cylinders of magnetic members $ML_{11}$ to $ML_{mn}$ of the memory parts $10_{11}$ to $10_{mn}$ from respective end portions $11b$ of the magnetic members $ML_{11}$ to $ML_{mn}$. The poles $25a$ extend in a z direction from the inside to the outside of the cylinders at the end portions $11b$ of the magnetic members $ML_{11}$ to $ML_{mn}$. Each of the poles $25a$ may have a substantially columnar shape with a diameter slightly smaller than an inner diameter of a magnetic member $ML_{ij}$.

As a magnetic material for the poles $25a$, for example, a 3d transition metal (for example, any of Fe, Co, or Ni) or an alloy containing the 3d transition metal is used.

As illustrated in FIG. 2, insulating layers 26 are provided corresponding to the plurality of poles $25a$ and located on these poles $25a$. The insulating layers 26 are provided between the poles $25a$ and a plurality of poles $25b$, and electrically disconnect the poles $25a$ from the poles $25b$. An insulating material such as a silicon oxide film is used for the insulating layers 26.

Figure 6:
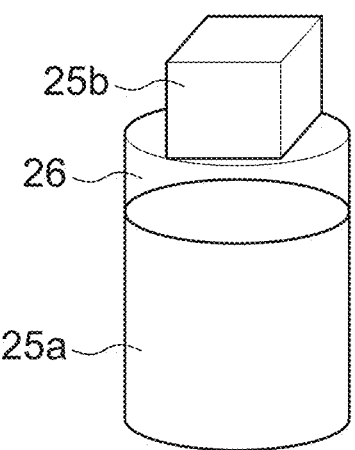
FIG. 6 is a perspective view illustrating a configuration example of the pole according to the first embodiment.

As illustrated in FIG. 1 or FIG. 2, the plurality of poles $25b$ are provided corresponding to the plurality of memory parts $10_{11}$ to $10_{mn}$. The poles $25b$ are provided corresponding to the magnetic members $ML_{11}$ to $ML_{mn}$ and located above (in a +z direction) the poles $25a$. The poles $25b$ are electrically disconnected from their corresponding poles $25a$ by the insulating layers 26. As illustrated in FIG. 6, each of the poles $25b$ is, for example, a substantially cuboid. In plan view seen from the z direction, the pole $25b$ may be sized slightly smaller than the inner diameter of the pole $25a$ and may be located on the inside of an outer edge of the pole $25a$. However, the pole $25b$ is not limited thereto, and may be sized larger than the inner diameter of the pole $25a$, and thus be located partially protruding outward from the pole $25a$.

As a magnetic material for the poles $25b$, for example, a 3d transition metal (for example, any of Fe, Co, or Ni) or an alloy containing the 3d transition metal is used.

As illustrated in FIG. 1, pole lines $PLL_j$ (j=1 to n) connected to the poles extend in the y direction intersecting the z direction and the x direction, and are arranged adjacent to each other in the x direction. Each of the pole lines $PLL_j$ is electrically connected to the poles $25b$ on a plurality of memory parts $10_{ij}$ arranged in the y direction. In plan view seen from the z direction, the pole lines $PLL_j$ intersect the bit lines $BL_i$ extending in the x direction. Each of the pole lines $PLL_j$ is connected at its opposite ends to a control circuit 100, and is controlled in such a manner that an electric current flows through the pole line $PLL_j$ bi-directionally. Each of the bit lines $BL_i$ is also connected to and controlled by the control circuit 100. It is allowable that the pole lines $PLL_j$ extend in the x direction and are arranged adjacent to each other in the y direction.

The pole line $PLL_j$ is provided corresponding to the memory parts $10_{1j}$ to $10_{mj}$ arranged in the j-th column. That is, a plurality of pole lines $PLL_1$ to $PLL_n$ correspond to magnetic members $ML_{11}$ to $ML_{m1}$, to magnetic members $ML_{12}$ to $ML_{m2}$, to magnetic members $ML_{13}$ to $ML_{m3}$, . . . to magnetic members $ML_{1n}$ to $ML_{mn}$, respectively. The memory parts $10_{1j}$ to $10_{mj}$ are located below the pole line $PLL_j$. In plan view seen from the z direction, the memory parts $10_{ij}$ to $10_{mj}$ overlap the pole line $PLL_j$. As illustrated in FIGS. 2 and 3, the pole line $PLL_j$ is located above (in the +z direction) the memory parts 10; in the j-th column. The pole line $PLL_j$ is in contact with upper faces $F25b1$ of a plurality of poles $25b$ corresponding to the memory parts $10_{1j}$ to $10_{mj}$, where the upper faces $F25b1$ face toward the +z direction.

For example, the pole line $PLL_2$ is provided for the memory parts $10_{12}$ to $10_{m2}$ arranged in the second column. As illustrated in FIGS. 2 and 3, the memory parts $10_{12}$ to $10_{m2}$ are located below the pole line $PLL_2$, while the pole line $PLL_2$ is located above the memory parts $10_{12}$ to $10_{m2}$ in the second column. In plan view seen from the z direction, the pole line $PLL_2$ is arranged so as to overlap each of the memory parts $10_{12}$ in the second column. Therefore, the pole line $PLL_2$ is in contact with the upper faces $F25b1$ of the plurality of poles $25b$ corresponding to the memory parts $10_{12}$ to $10_{m2}$, where the upper faces $F25b1$ face toward the +z direction.

As illustrated in FIG. 2, the pole line $PLL_j$ is provided near the second end portion $11b$ of the memory part $10_{ij}$. The pole line $PLL_j$ is electrically connected to the pole $25b$, while being electrically insulated from the pole $25a$ and the memory part $10_{ij}$. Materials that exhibit the SOT (Spin-Orbit-Torque) effect, such as a heavy metal and a topological material, are used for the pole line $PLL_j$. Specifically, any of W, Ta, Pt, Pd, Hf, Ir, Re, Ag, Au, Bi, Sb, Se, Te, or Mo, or alloys or compounds containing any of these materials are used.

A plate electrode PL is provided around the end portions $11b$ of the plurality of magnetic members $ML_{11}$ to $ML_{mn}$, and is electrically disconnected from the poles $25b$. The plate electrode PL is electrically connected in common to the end portions $11b$ of the magnetic members $ML_{11}$ to $ML_{mn}$. The plate electrode PL extends two-dimensionally over the xy-plane, and is shared between the magnetic members $ML_{11}$ to $ML_{mn}$. For example, a magnetic material such as Fe, Co, or Ni or an alloy containing any of these materials, or a conductive metal material such as W, Cu, or Pt or an alloy containing any of these materials is used for the plate electrode PL.

As illustrated in FIGS. 2 and 3, each memory part $10_{ij}$ includes a magnetic memory line (magnetic member) $ML_{ij}$ formed of a conductive magnetic body, a non-magnetic conductive layer $12_{ij}$, a magnetoresistive element $14_{ij}$, a non-magnetic conductive layer $16_{ij}$, a vertical thin-film transistor $18_{ij}$, and a non-magnetic conductive layer $19_{ij}$.

Each magnetic member $ML_{ij}$ is formed of a perpendicular magnetic material extending in the vertical direction (z direction) in FIGS. 2 and 3, and has a cylindrical shape. Each magnetic member $ML_{ij}$ includes the first end portion $11a$ and the second end portion $11b$. The memory part $10_{ij}$ may have a substantially circular cylindrical shape as illustrated in FIG. 1, or may have a substantially square cylindrical shape.

Figure 4:
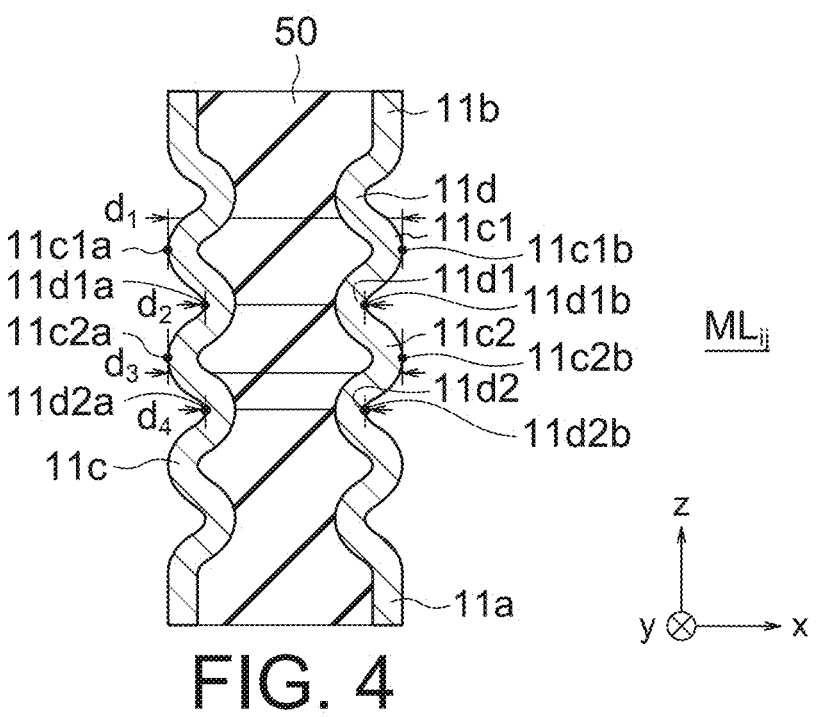
FIG. 4 is a cross-sectional view illustrating a configuration example of a magnetic member.

FIG. 4 is a cross-sectional view illustrating a configuration example of the magnetic member $ML_{ij}$. A non-magnetic insulator 50 may be provided in the cylinder of each magnetic member $ML_{ij}$. That is, each magnetic member $ML_{ij}$ may be provided so as to surround the non-magnetic insulator 50. In the magnetic member $ML_{ij}$, as illustrated in FIG. 4, a region $11c1$, a constricted portion $11d1$, a region $11c2$, and a constricted portion $11d2$ are located in the z direction. In a cross-section of the region $11c1$ taken along the z direction, a length (diameter) of the region $11c1$ in the x direction between an end portion $11c1a$ and an end portion $11c1b$ is represented as $d1$. In a cross-section of the constricted portion $11d1$ taken along the z direction, a length (diameter) of the constricted portion $11d1$ in the x direction between an end portion $11d1a$ and an end portion $11d1b$ is represented as $d2$. In a cross-section of the region $11c2$ taken along the z direction, a length (diameter) of the region $11c2$ in the x direction between an end portion $11c2a$ and an end portion $11c2b$ is represented as $d3$. In a cross-section of the constricted portion $11d2$ taken along the z direction, a length (diameter) of the constricted portion $11d2$ in the x direction between an end portion $11d2a$ and an end portion $11d2b$ is represented as $d4$. In this case, the following conditions are satisfied.

$$d1>d2$$

$$d1>d4$$

$$d3>d2$$

$$d3>d4$$

Referring back to FIG. 2, the magnetic member $ML_{ij}$ is electrically connected at the first end portion $11a$ to the magnetoresistive element $14_{ij}$ through the non-magnetic conductive layer $12_{ij}$. The non-magnetic conductive layer $12_{ij}$ may be omitted. In this case, the first end portion $11a$ of the magnetic member $ML_{ij}$ is directly connected to the magnetoresistive element $14_{ij}$. The bit line BL is provided near the first end portion $11a$ of the magnetic member $ML_{ij}$. The bit lines BL extend in the x direction that intersects the direction in which the pole lines $PLL_1$ to $PLL_n$ extend, and are arranged in the y direction.

Figure 5:
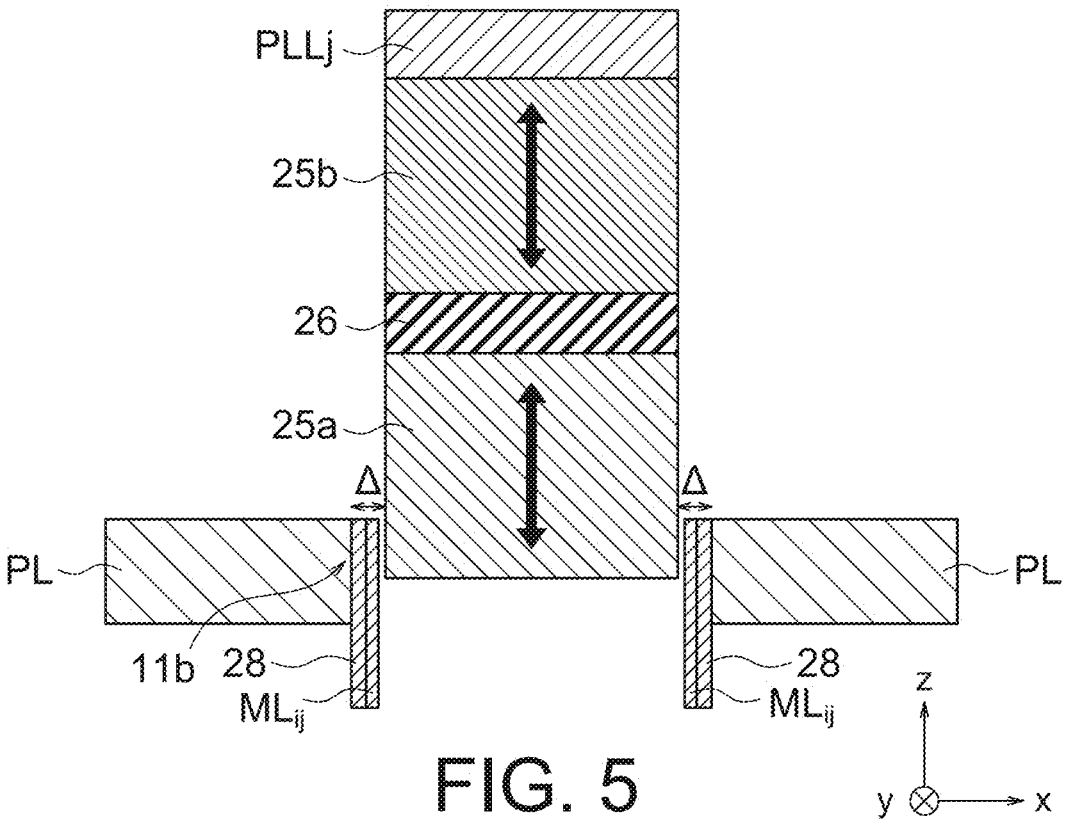
FIG. 5 is a cross-sectional view illustrating a configuration example of a second end portion of the magnetic member and a pole and its surrounding area.

FIG. 5 is a cross-sectional view illustrating a configuration example of the second end portion $11b$ of the magnetic member $ML_{ij}$, and the pole and its surrounding area. The second end portion $11b$ of each magnetic member $ML_{ij}$ is electrically connected to the plate electrode PL. A lateral side of the plate electrode PL is provided facing the lateral side of the pole $25a$. The insulating layer 26, the pole $25b$, and each of the pole lines $PLL_1$ to $PLL_n$ are arranged on the pole $25a$. The poles $25a$ and $25b$ are provided corresponding to each of the memory parts $10_{ij}$ as illustrated in FIG. 1 in plan view seen from the z direction. The poles $25a$ and $25b$ are positioned at a central portion of the cylinder of each magnetic member $ML_{ij}$ and are magnetically connected to the magnetic member $ML_{ij}$. The expression "A is magnetically connected to B" means that A and B form a magnetic circuit, and includes a case where the magnetic bodies are not in direct contact with each other. The insulating layer 26 is provided between the pole $25a$ and the pole $25b$, and electrically disconnects the pole $25a$ from the pole $25b$, while magnetically connecting these poles $25a$ and $25b$.

A magnetic gap $\Delta$ is provided between the plate electrode PL and the pole $25a$. For example, the magnetic gap $\Delta$ of about 5 nm is provided. In order to increase the intensity of a write magnetic field to be generated in the magnetic gap $\Delta$, it is desirable that the plate electrode PL is made of magnetic material. The second end portion $11b$ of the magnetic member $ML_{ij}$ is provided in the magnetic gap $\Delta$ between the plate electrode PL and the pole $25a$ corresponding to this second end portion $11b$, and is interposed between these plate electrode PL and pole $25a$. The pole $25a$ is inserted in the cylinder through an opening of the second end portion $11b$ of the corresponding magnetic member $ML_{ij}$ and faces an inner lateral side of the second end portion $11b$ of this magnetic member $ML_{ij}$. It is allowable that although not illustrated, a thin insulating layer (for example, an MgO film) is provided between the pole $25a$ and the magnetic member $ML_{ij}$ in order to maintain the breakdown voltage. However, it is allowable that the pole $25a$ and the magnetic member $ML_{ij}$ are electrically connected as long as the breakdown voltage can be maintained.

A non-magnetic conductive layer 28 is located on an outer lateral side of the magnetic member $ML_{ij}$. The plate electrode PL is electrically connected to the magnetic member $ML_{ij}$ through the conductive layer 28. The conductive layer 28 is provided between the plate electrode PL and the outer lateral side of each of the magnetic members $ML_{ij}$. That is, the sum of the thickness of the magnetic member $ML_{ij}$ in the x direction and the thickness of the conductive layer 28 in the x direction is substantially equivalent to the magnetic gap $\Delta$. Materials that exhibit the SOT (Spin-Orbit-Torque) effect, such as a heavy metal and a topological material, are used for the conductive layer 28. Specifically, any of W, Ta, Pt, Pd, Hf, Ir, Re, Ag, Au, Bi, Sb, Se, Te, or Mo, or alloys or compounds containing any of these materials are used. It is allowable that the conductive layer 28 is located between the pole $25a$ and the inner lateral side of the magnetic member $ML_{ij}$.

FIG. 6 is a perspective view illustrating a configuration example of the pole according to the first embodiment. The pole $25a$ has, for example, a substantially columnar shape, and has a diameter slightly smaller than the inner diameter of the magnetic member ML in plan view seen from the z direction. For example, the pole $25b$ is a substantially cuboid.

Referring back to FIGS. 2 and 3, the magnetic memory in the present embodiment is further described below. The magnetoresistive element $14_{ij}$ reads information written into the magnetic member $ML_{ij}$. For example, an MTJ (Magnetic Tunnel Junction) element is used as the magnetoresistive element $14_{ij}$. Hereinafter, the magnetoresistive element $14_{ij}$ is described as being the MTJ element. The MTJ element $14_{ij}$ includes a free layer (magnetization free layer) $14a$ with its magnetization direction being variable, a fixed layer (reference layer) $14c$ with its magnetization direction being fixed, and a non-magnetic insulating layer $14b$ located between the free layer $14a$ and the fixed layer $14c$. In the MTJ element $14_{ij}$, the free layer $14a$ is electrically connected to the first end portion $11a$ of the magnetic member $ML_{ij}$ through its corresponding non-magnetic conductive layer $12_{ij}$, and the fixed layer $14c$ is electrically connected to its corresponding vertical thin-film transistor $18_{ij}$ through its corresponding non-magnetic conductive layer $16_{ij}$. The expression "its magnetization direction being variable" means that the magnetization direction can be changed by a leak magnetic field from the corresponding magnetic member $ML_{ij}$ in a read operation to be described later. The expression "its magnetization direction being fixed" means that the magnetization direction remains unchanged regardless of a leak magnetic field from the corresponding magnetic member $ML_{ij}$.

The vertical thin-film transistor $18_{ij}$ serving as a switching element is electrically connected at its one end to the fixed layer $14c$ of the MTJ element $14_{ij}$ through the non-magnetic conductive layer $16_{ij}$, while being electrically connected at the other end to the bit line $BL_i$ through the non-magnetic conductive layer $19_{ij}$. That is, each transistor $18_{ij}$ is connected between the MTJ element $14_{ij}$ and the bit line $BL_i$. The transistor $18_{ij}$ includes a channel layer $18a$ extending in the z direction, and a gate electrode portion $SG_j$ located so as to surround or sandwich the channel layer $18a$. That is, the gate electrode portion $SG_j$ covers at least a part of the channel layer. The channel layer $18a$ is made of, for example, crystalline silicon. The gate electrode portion $SG_j$ extends in the y direction, and is connected to and controlled by the control circuit 100.

(Write Operation)

Next, a write operation of the magnetic memory according to the present embodiment is described.

Figure 7:
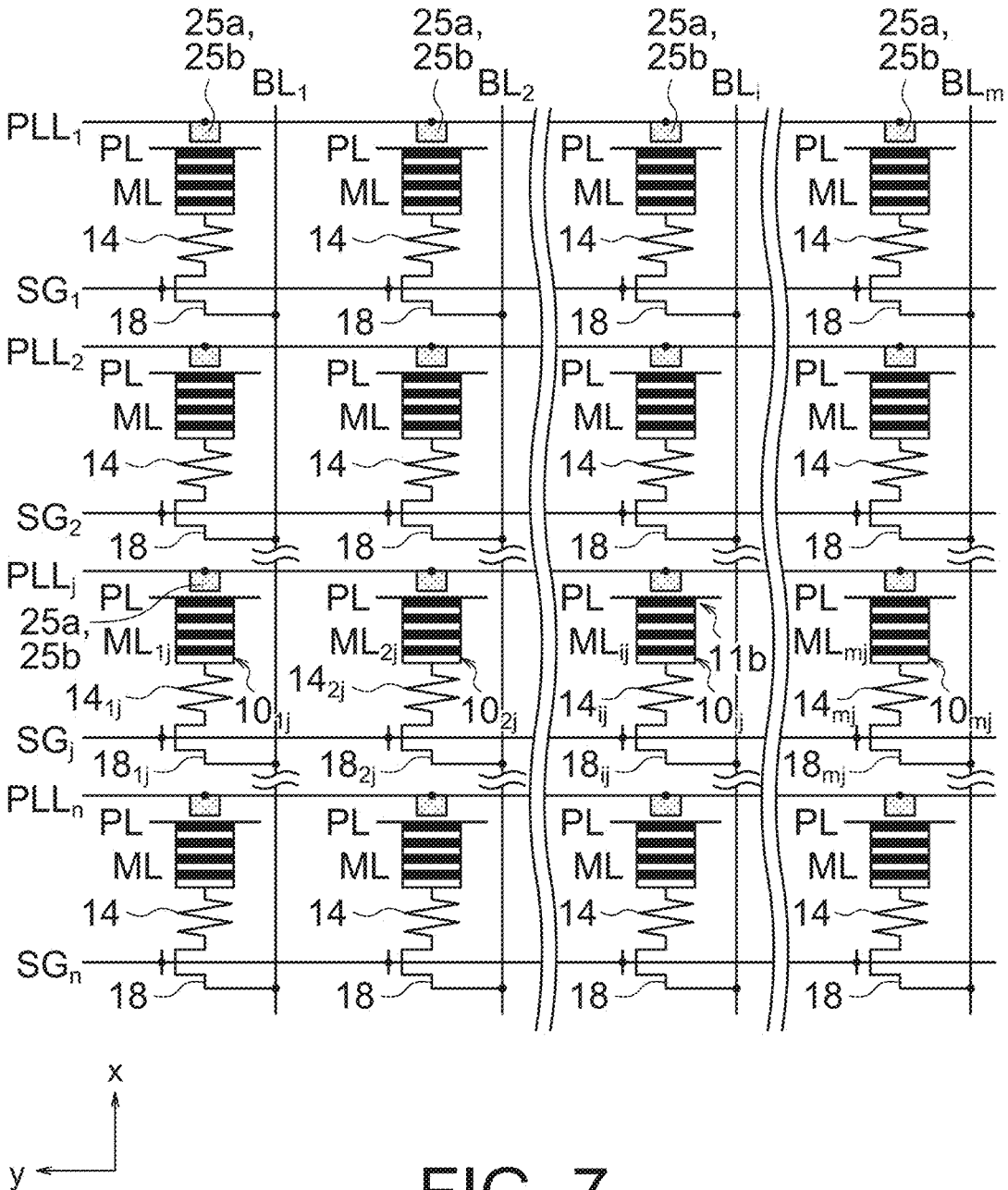
FIG. 7 is an equivalent circuit diagram of the magnetic memory according to the first embodiment.

FIG. 7 is an equivalent circuit diagram of the magnetic memory according to the first embodiment. An operation of the magnetic memory to selectively write data into the memory parts 101) to $10_{mj}$ in the j-th column of FIG. 7 is described below.

The magnetic memory according to the present embodiment uses the SOT (Spin-Orbit Torque) effect to reverse magnetization of the pole $25b$ and indirectly write data into the memory parts $10_{1j}$ to $10_{mj}$. The SOT effect is induced when the magnetic memory passes a write current through a structure in which a non-magnetic material and a magnetic material are layered. In the magnetic material, polarized spins are accumulated and then the angular momentum of the spins is transferred to magnetization, thereby to exert a torque on the magnetization of the magnetic material. As the direction of the current is changed, the direction of the torque is reversed. Therefore, it is possible to reverse the magnetization direction of the magnetic material. In order to cause this magnetization reversal, it is effective to apply an assist magnetic field in a direction parallel to that of the write current during the write operation. As the assist magnetic field, it is allowable to use an induction magnetic field generated by an electric current flowing through a wire separately provided, a leak magnetic field from a magnetic body provided in the vicinity, or other magnetic fields.

In the present embodiment, the control circuit 100 passes a write current selectively through any of the pole lines $PLL_j$. At this time, the magnetization direction of a plurality of poles $25b$ connected to the selected pole line $PLL_j$ is set according to the direction of the current flowing through the selected pole line $PLL_j$. The magnetization of the poles $25b$ affects the poles $25a$ that are magnetically connected thereto through the insulating layers 26, and sets the direction of magnetization of the poles $25a$ to the same direction as the poles $25b$. The magnetization of the poles $25a$ affects the second end portions $11b$ of the magnetic members $ML_{ij}$ to $ML_{mj}$ that are magnetically connected to the poles $25a$. This magnetization of the poles $25a$ is set in a magnetic domain near the second end portions $11b$ of the magnetic members $ML_{ij}$ to $ML_{mj}$. The control circuit 100 controls the magnetization direction of the poles $25a$ through the magnetization reversal of the poles $25b$ in this manner, so that the magnetic memory can write different logics of data into the memory parts $10_{1j}$ to $10_{mj}$.

As illustrated in FIG. 5, the magnetization of the pole $25b$ is transferred to the pole $25a$, while the pole $25a$ is electrically disconnected from the pole $25b$ and the pole line $PLL_j$ by the insulating layer 26. Therefore, the capacitance of the pole line $PLL_j$ is only added with the capacitance of a plurality of poles $25b$ connected to this pole line $PLL_j$, and is not added with the capacitance of the poles $25a$ and the magnetic members $ML_{ij}$ to $ML_{mj}$. That is, it is possible to maintain the capacitance of the pole line $PLL_j$ at a relatively small value by the insulating layer 26. As the pole line $PLL_j$ has a smaller capacitance, the amount of electric charge required to drive the voltage of the pole line $PLL_j$ is reduced. Accordingly, the load on and the power consumption of the control circuit 100 are reduced. The speed to drive the voltage of the pole line $PLL_j$ is increased, and the data writing speed is increased accordingly.

In a single write operation, a single data element ("0" or "1") is written simultaneously into a plurality of magnetic members $ML_{ij}$ to $ML_{mj}$ arranged in a single column. For example, the control circuit 100 writes data "1" into the magnetic domains at the second end portions $11b$ of all m magnetic members $ML_{ij}$ to $ML_{mj}$ arranged in the j-th column. Subsequently, the control circuit 100 activates the gate electrode parts $SG_j$ to bring the transistors $18_{ij}$ to $18_{mj}$ into a conductive state. The control circuit 100 passes a shift current selectively through a single memory part 10 or a plurality of memory parts 10 of the memory parts $10_{1j}$ to $10_{mj}$, which need to store therein the data "1", between the plate electrode PL and the bit line BL corresponding to each of the memory parts 10. This causes the data "1" to move toward the MTJ element 14. In a case where the data "1" needs to be stored in a plurality of memory parts 10, the control circuit 100 performs the above shift operation for the data "1" on each of the memory parts 10. This causes the data "1" to be shifted to and stored in a desired magnetic domain of a single magnetic member ML or a plurality of magnetic members ML of the magnetic members $ML_{ij}$ to $ML_{mj}$.

Next, the control circuit 100 writes data "0" into the magnetic domains at the second end portions $11b$ of all m memory parts $10_{1j}$ to $10_{mj}$ arranged in the j-th column. Subsequently, the control circuit 100 activates the gate electrode parts $SG_j$ again to bring the transistors $181j$ to $18_{mj}$ into a conductive state. The control circuit 100 passes a shift current selectively through a single memory part 10 or a plurality of memory parts 10 of the memory parts $10_{1j}$ to $10_{mj}$, which need to store therein the data "0", between the plate electrode PL and the bit line BL corresponding to each of the memory parts 10. This causes the data "0" to move toward the MTJ element 14. In a case where the data "0" needs to be stored in a plurality of memory parts 10, the control circuit 100 performs the above shift operation for the data "0" on each of the memory parts 10. This causes the data "0" to be shifted to and stored in a desired magnetic domain of a single magnetic member ML or a plurality of magnetic members ML of the magnetic members $ML_{ij}$ to $ML_{mj}$.

The write operation into the memory parts $10_{1j}$ to $10_{mj}$ arranged in the j-th column is ended by performing the two operations described above. In a single write operation, data is written simultaneously into a plurality of memory parts $10_{1j}$ to $10_{mj}$ arranged in a single column, so that it is possible to reduce the write power consumption per bit.

(Read Operation)

Next, a read operation is explained. For example, in a case where the magnetic memory reads data from the memory part $10_{ij}$, when the data to be read is located at the lowermost portion of the magnetic member $ML_{ij}$ of the memory part $10_{ij}$, that is, a magnetic domain closest to the MTJ element $14_{ij}$, the magnetization direction in the free layer $14a$ of the MTJ element $14_{ij}$ has been set depending on the data stored in the lowermost portion of the magnetic member $ML_{ij}$. Accordingly, the control circuit $100$ passes a read current between the plate electrode PL and the bit line $BL_i$ to read the data from the MTJ element $14_{ij}$. The read data corresponds to a resistance state of the MTJ element $14_{ij}$. For example, when the MTJ element $14_{ij}$ has a higher resistance, the magnetization directions of the free layer $14a$ and the fixed layer $14c$ of the MTJ element $14_{ij}$ are closer to the antiparallel state (for example, 90 degrees or greater), compared to when the MTJ element $14_{ij}$ has a lower resistance. When the MTJ element $14_{ij}$ has a lower resistance, the magnetization directions of the free layer $14a$ and the fixed layer $14c$ of the MTJ element $14_{ij}$ are closer to the parallel state (for example, 90 degrees or smaller), compared to when the MTJ element $14_{ij}$ has a higher resistance.

When data to be read is not located in the lowermost portion of the magnetic member $ML_{ij}$ of the memory part $10_{ij}$, the control circuit $100$ passes a shift current between the plate electrode PL and the bit line $BL_i$ to move the data to be read so as to be located in the lowermost portion of the magnetic member $ML_{ij}$. Thereafter, the control circuit $100$ can read the data by performing the read operation described above.

As described above, according to the present embodiment, the pole $25a$ is electrically disconnected from the pole $25b$ and the pole line PLL by the insulating layer $26$. With this configuration, it is possible to separate a path of the write current from a path of the shift current or the read current. Due to the insulating layer $26$, the pole line PLL has a relatively small capacitance, and thus the amount of electric charge required to drive the voltage of the pole line PLL is reduced. With this configuration, the load on and the power consumption of the control circuit $100$ are reduced. The speed to drive the voltage of the pole line PLL is increased, and the data writing speed is increased accordingly.

The pole $25a$ is electrically disconnected from the pole $25b$ and the pole line PLL by the insulating layer $26$, while being magnetically connected to the pole $25b$ and the pole line PLL. Therefore, when passing a write current through the pole line PLL, the magnetic memory sets magnetization dependent on the direction of the write current for the pole $25b$ by using the SOT effect. Further, the magnetization of the pole $25b$ is transferred from the pole $25b$ to the pole $25a$, and data is written from the pole $25a$ into the second end portion $11b$ of the magnetic member $ML_{ij}$. That is, the magnetic memory according to the present embodiment can efficiently write data into the second end portion $11b$ of the magnetic member $ML_{ij}$ by using the SOT effect when passing a write current through the pole line PLL.

Second Embodiment

Figure 8:
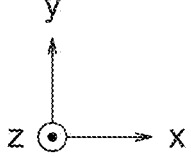
FIG. 8 is a plan view illustrating a configuration example of a magnetic memory according to a second embodiment.
Figure 9:
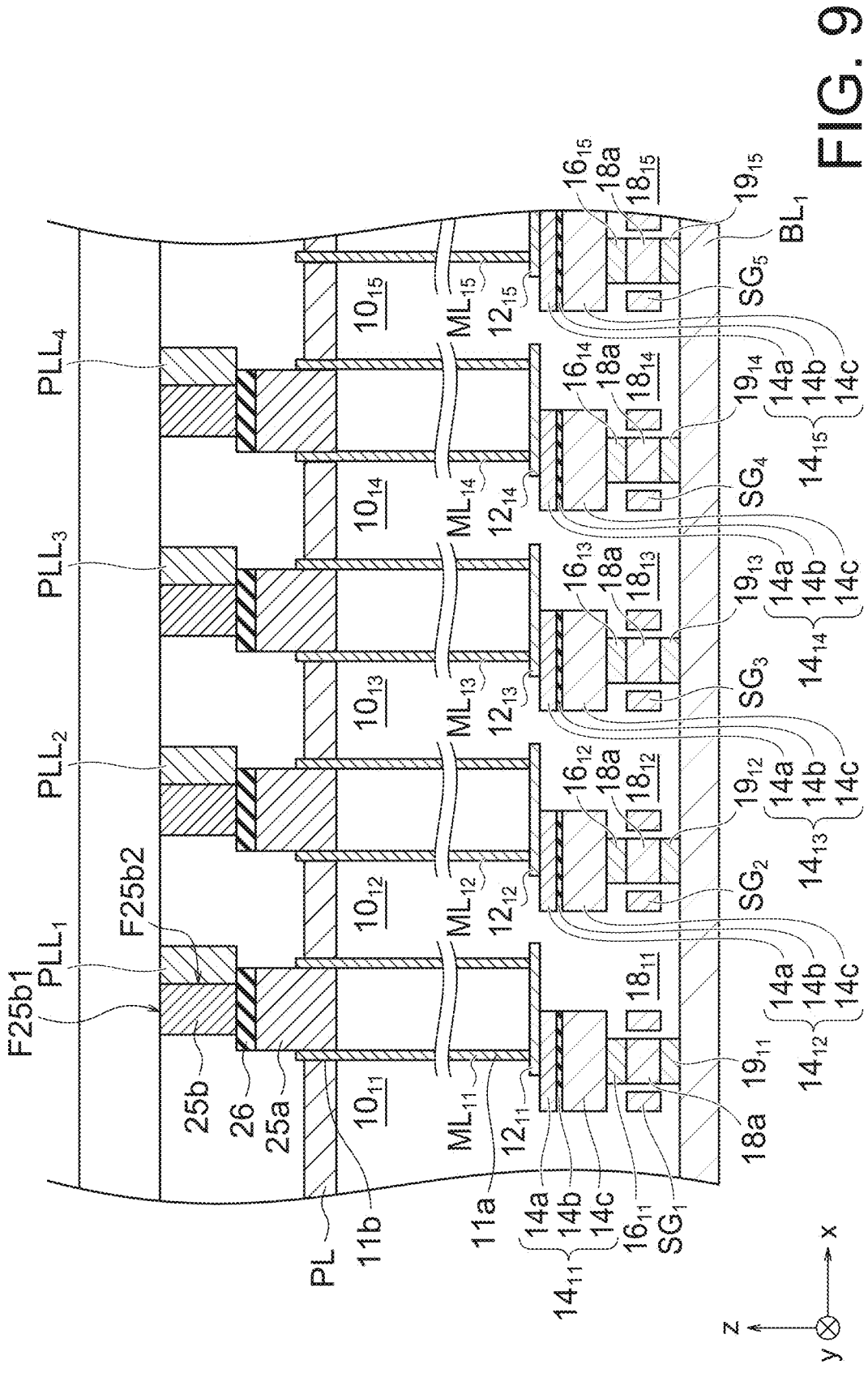
FIG. 9 is a cross-sectional view taken along a line A-A illustrated in FIG. 8.

FIG. 8 is a plan view illustrating a configuration example of a magnetic memory according to a second embodiment. FIG. 9 is a cross-sectional view taken along the line A-A illustrated in FIG. 8. In the second embodiment, the pole lines $PLL_1$ to $PLL_n$ are in contact with side faces $F25b2$ of a plurality of poles $25b$ arranged in the y direction, where the side faces $F25b2$ face toward the x direction. The pole lines $PLL_1$ to $PLL_n$ are provided on the side faces $F25b2$ of the poles $25b$ in the manner as described above, so that magnetization that occurs in the poles $25b$ when the magnetic memory passes a write current through the pole lines $PLL_1$ to $PLL_n$ may be optimized. It is allowable that the pole lines $PLL_1$ to $PLL_n$ are in contact with the side faces $F25b2$ of the poles $25b$ facing toward the +x direction, or are in contact with other side faces of the poles $25b$ facing toward a –x direction.

The rest of the configurations of the second embodiment may be identical to that of the first embodiment. Accordingly, the second embodiment can obtain the same effects as those of the first embodiment.

Third Embodiment

Figure 10:
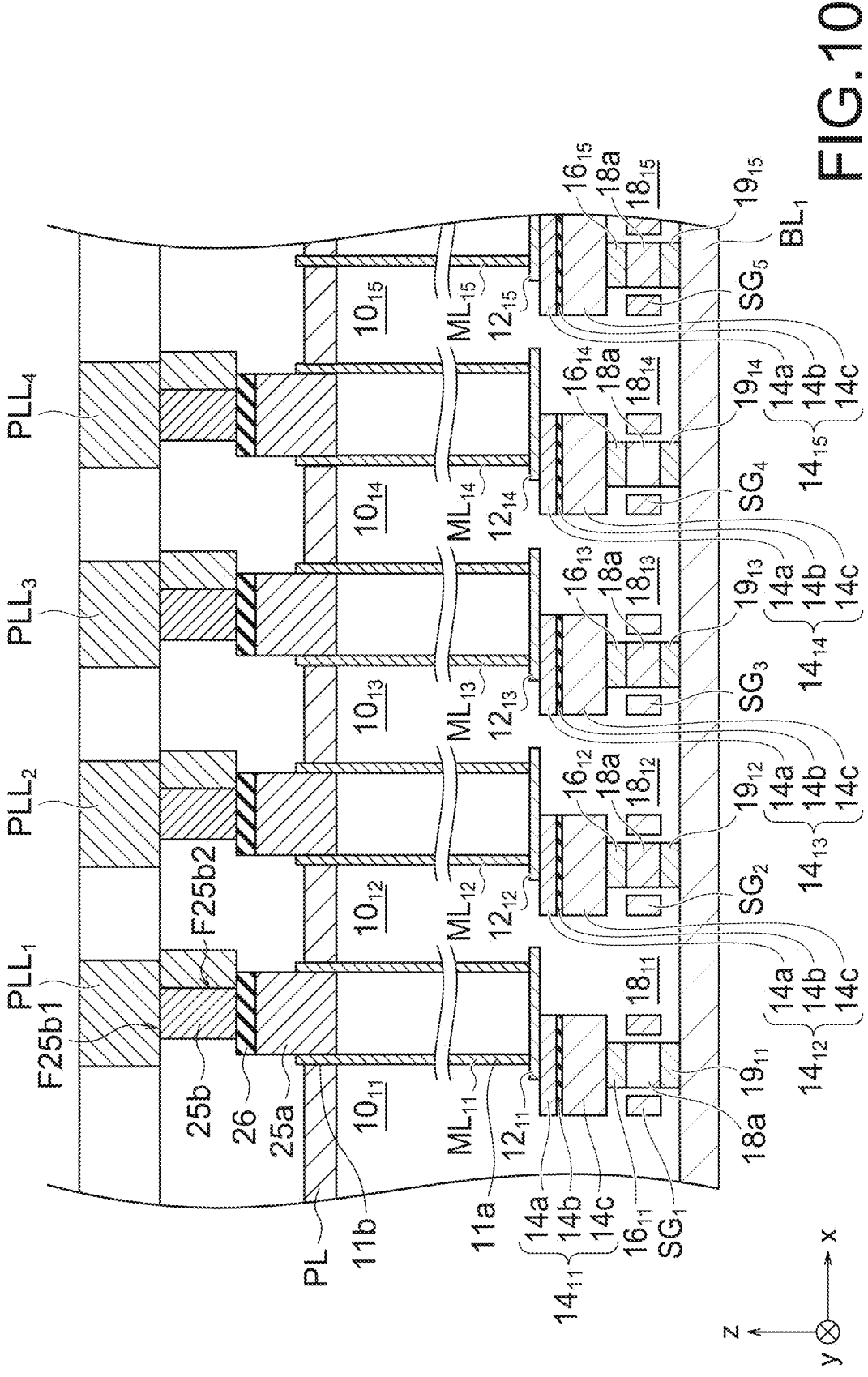
FIG. 10 is a cross-sectional view illustrating a configuration example of a magnetic memory according to a third embodiment.

FIG. 10 is a cross-sectional view illustrating a configuration example of a magnetic memory according to a third embodiment. The cross-sectional view of FIG. 10 corresponds to the cross-section taken along the line A-A of FIG. 1 or FIG. 8. In the third embodiment, the pole lines $PLL_1$ to $PLL_n$ are in contact with both top faces $F25b1$ and the side faces $F25b2$ of a plurality of poles $25b$ arranged in the y direction. The pole lines $PLL_1$ to $PLL_n$ are provided on the top faces $F25b1$ and the side faces $F25b2$ of the poles $25b$ in the manner as described above, so that the magnetic memory sets magnetization that occurs in the poles $25b$ when passing a write current through these pole lines $PLL_1$ to $PLL_n$.

The pole lines PLL located on the top face $F25b1$ and on the side face $F25b2$ of each pole $25$ may be electrically disconnected from each other or may be electrically connected to each other.

The rest of the configurations of the third embodiment may be identical to that of the first or second embodiment. Accordingly, the third embodiment can obtain the same effects as those of the first or second embodiment.

Fourth Embodiment

Figure 11:
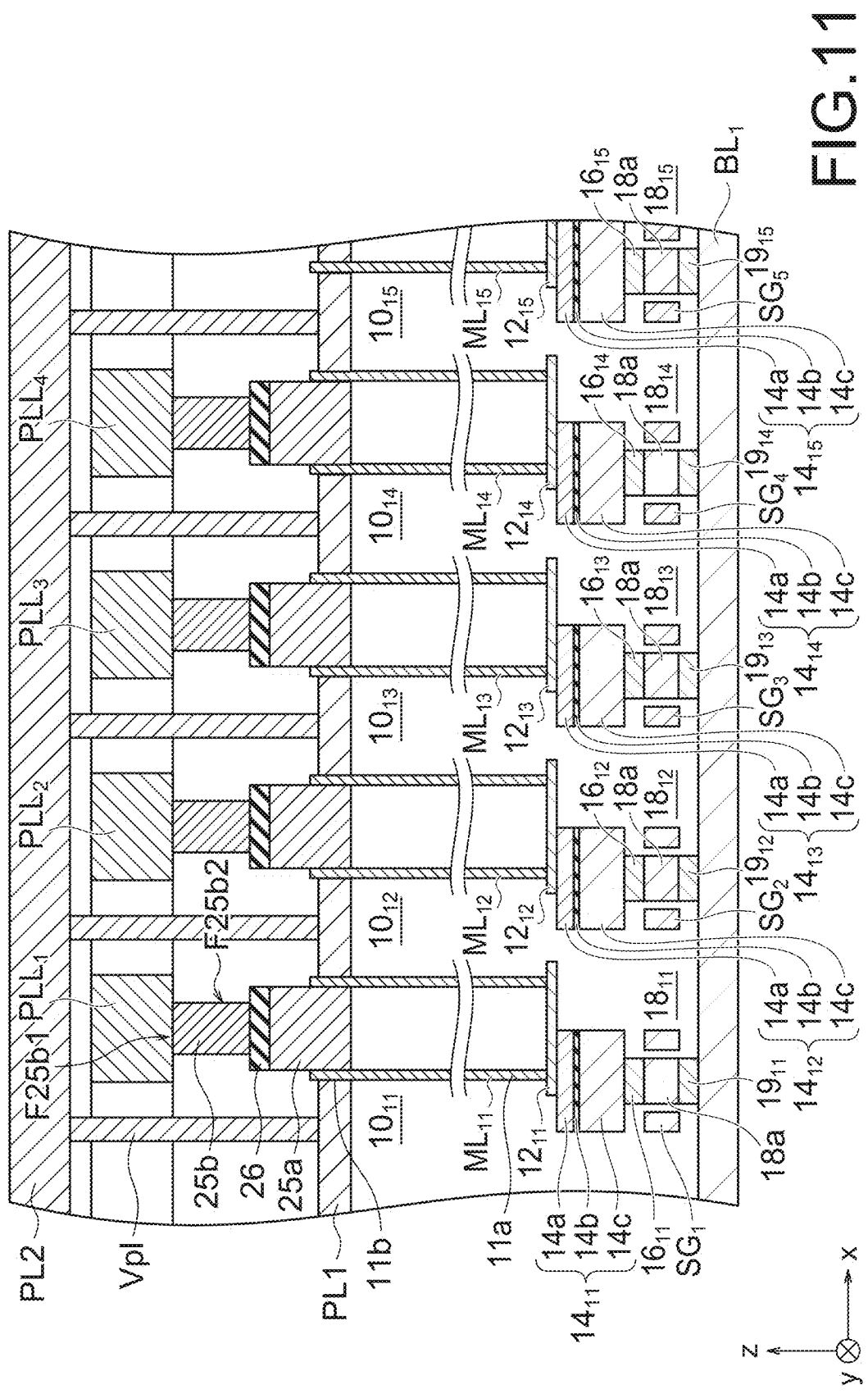
FIG. 11 is a cross-sectional view illustrating a configuration example of a magnetic memory according to a fourth embodiment.
Figure 12:
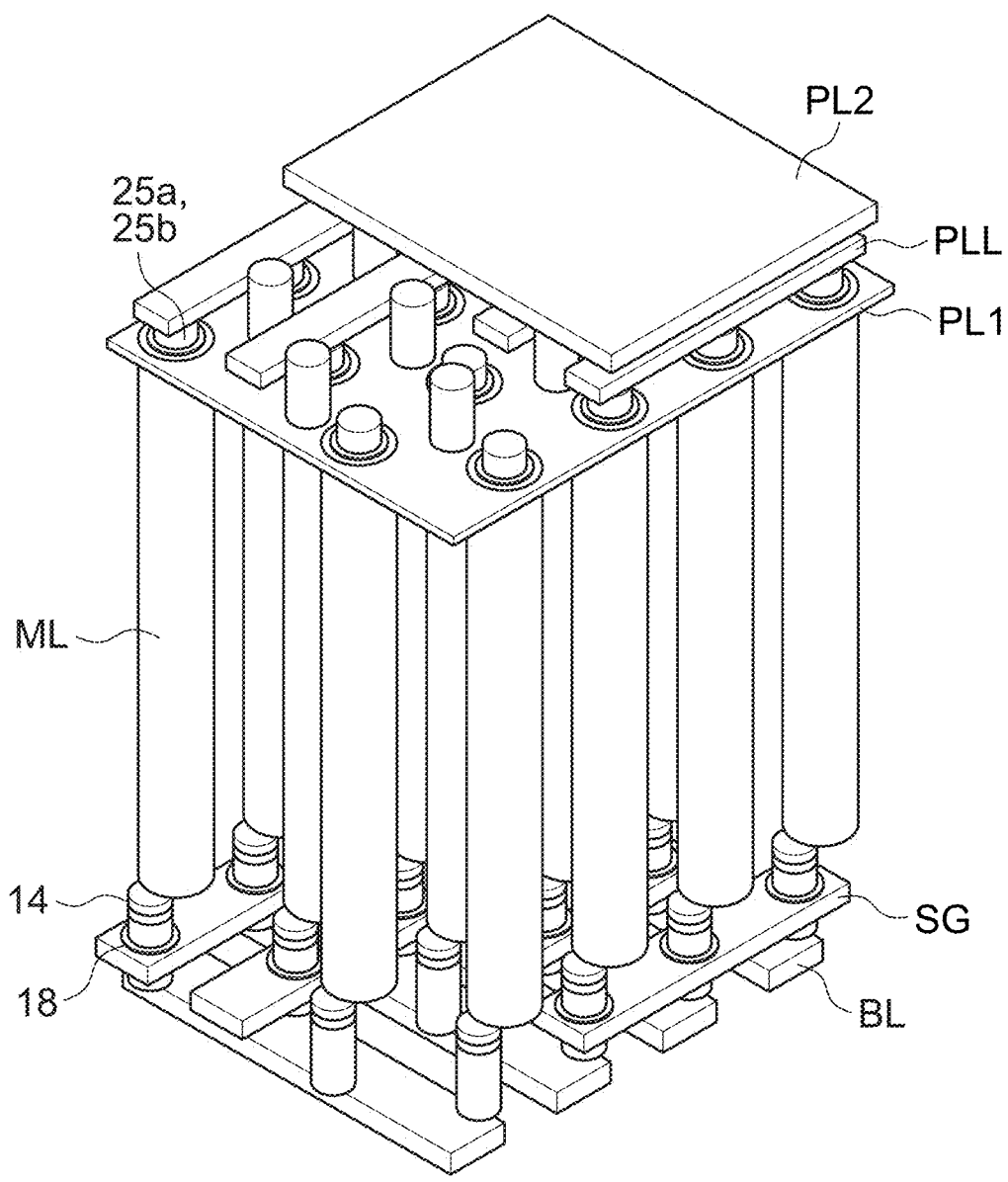
FIG. 12 is a perspective view illustrating a configuration example of the magnetic memory according to the fourth embodiment.

FIG. 11 is a cross-sectional view illustrating a configuration example of a magnetic memory according to a fourth embodiment. The cross-sectional view of FIG. 11 corresponds to the cross-section taken along the line A-A of FIG. 1 or FIG. 8. FIG. 12 is a perspective view illustrating a configuration example of the magnetic memory according to the fourth embodiment.

In the fourth embodiment, the magnetic memory includes plate electrodes PL1 and PL2, and via contacts Vpl.

The plate electrode PL1 may have a configuration identical to that of the plate electrode PL in the first to third embodiments.

The plate electrode PL2 is located above (in the +z direction, that is, a direction to which the plate electrode PL2 is distanced from the magnetic member $ML_{ij}$) the plate electrode PL1, the poles $25a$ and $25b$, and the pole lines $PLL_1$ to $PLL_n$. The plate electrode PL2 is electrically connected to the plate electrode PL1 via the via contacts Vpl. The plate electrode PL2 is electrically disconnected from the poles $25a$ and $25b$, and the pole lines $PLL_1$ to $PLL_n$ similarly to the plate electrode PL1. The plate electrode PL2 is provided in common to the plurality of magnetic members $ML_{11}$ to $ML_{mn}$, and is electrically connected to the end portions $11b$ of the magnetic members $ML_{11}$ to $ML_{mn}$. Consequently, the plate electrode PL2 along with the plate PL1 is shared between the plurality of magnetic members $ML_{11}$ to $ML_{mn}$. The plate electrode PL2 extends two-dimensionally over an xy-plane other than the xy-plane of the plate electrode PL1. For the plate electrode PL2, for example, a conductive material with a lower resistance than the conductive material of the plate electrode PL1 may be used. Examples of such a conductive material to be used include conductive metal materials such as W, Cu, and Pt. Further, for the plate electrode PL2, a magnetic material such as Fe, Co, or Ni, or an alloy containing any of these materials may be used.

The via contacts Vpl are provided between the plate electrode PL1 and the plate electrode PL2, and electrically connects the plate electrode PL1 and the plate electrode PL2. The via contacts Vpl are provided so as to penetrate an interlayer dielectric film between the plate electrode PL1 and the plate electrode PL2 in the z direction. A conductive metal material such as tungsten is used for the via contacts Vpl.

Providing the plate electrode PL2 makes it possible to substantially reduce an electrical resistance value of the plate electrode PL1. For this reason, the fourth embodiment is advantageous when the plate electrode PL1 has a high resistance value.

The rest of the configurations of the fourth embodiment may be identical to that of the first embodiment. Accordingly, the fourth embodiment can obtain the same effects as those of the first embodiment. The fourth embodiment may be combined with the second or third embodiment. In this case, the fourth embodiment can obtain the same effects as those of the second or third embodiment.

Fifth Embodiment

Figure 13:
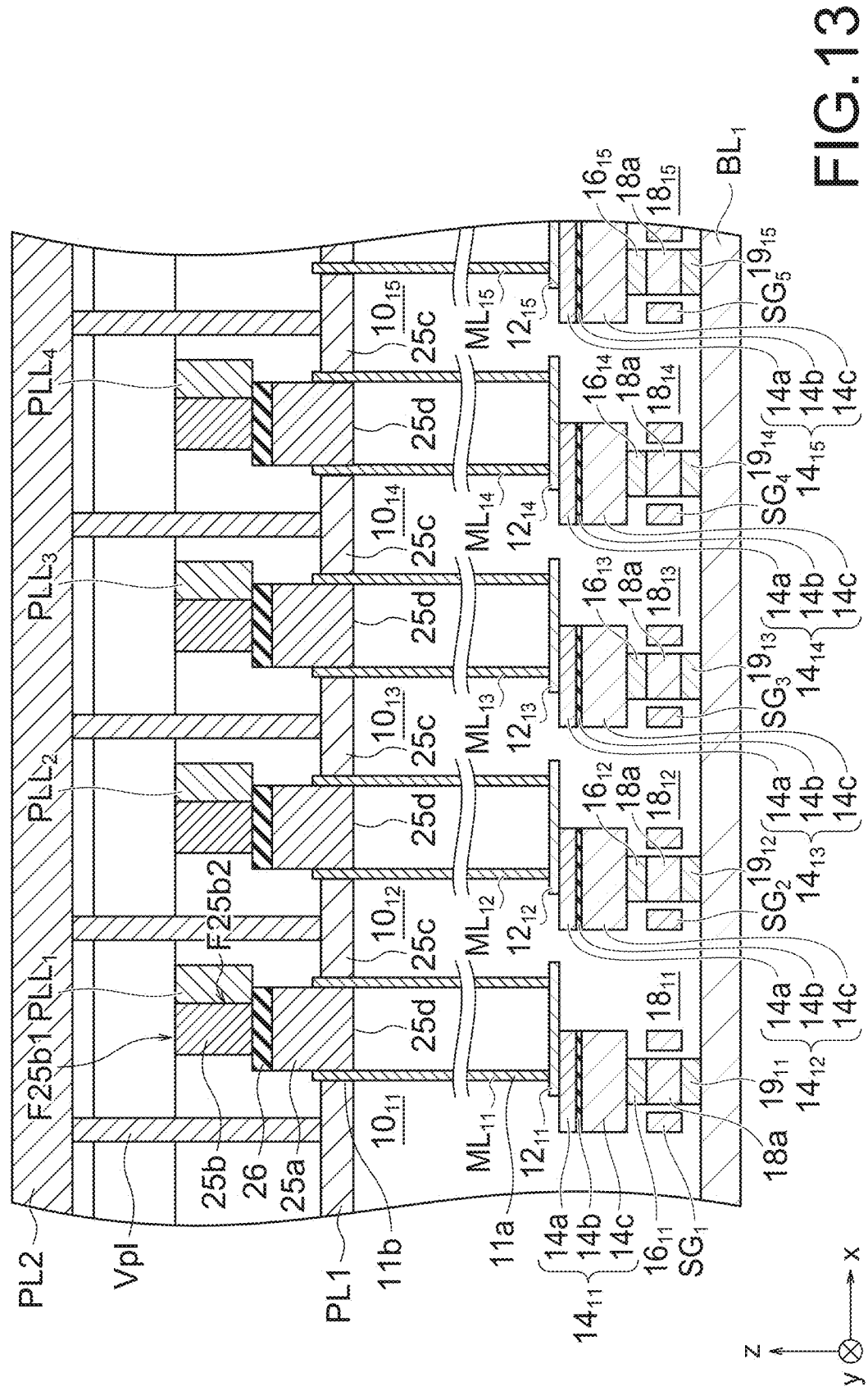
FIG. 13 is a cross-sectional view illustrating a configuration example of a magnetic memory according to a fifth embodiment.

FIG. 13 is a cross-sectional view illustrating a configuration example of a magnetic memory according to a fifth embodiment. The cross-sectional view of FIG. 13 corresponds to the cross-section taken along the line A-A of FIG. 1 or FIG. 8. The fifth embodiment is a combination of the second embodiment and the fourth embodiment. Therefore, the magnetic memory in the fifth embodiment includes the plate electrodes PL1 and PL2, and the via contacts Vpl. Further, the pole lines $PLL_1$ to $PLL_n$ are provided on the side faces F25b2 of the poles 25b.

The rest of the configurations of the fifth embodiment may be identical to that of the second or fourth embodiment. Accordingly, the fifth embodiment can obtain the same effects as those of the second and fourth embodiments.

Sixth Embodiment

Figure 14:
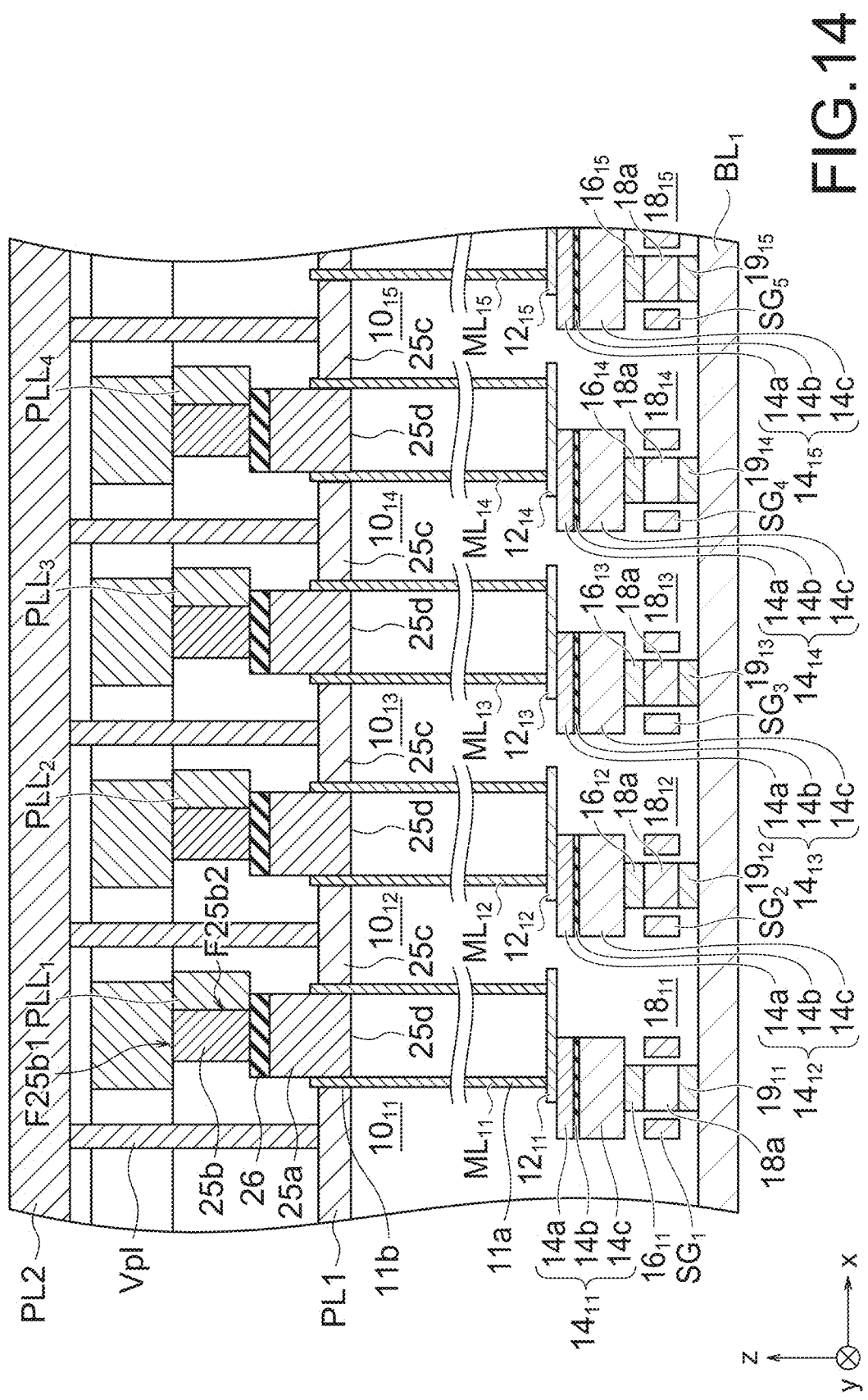
FIG. 14 is a cross-sectional view illustrating a configuration example of a magnetic memory according to a sixth embodiment.

FIG. 14 is a cross-sectional view illustrating a configuration example of a magnetic memory according to a sixth embodiment. The cross-sectional view of FIG. 14 corresponds to the cross-section taken along the line A-A of FIG. 1 or FIG. 8. The sixth embodiment is a combination of the third embodiment and the fourth embodiment. Therefore, the magnetic memory in the sixth embodiment includes the plate electrodes PL1 and PL2, and the via contacts Vpl. Further, the pole lines $PLL_1$ to $PLL_n$ are provided on both the top faces F25b1 and the side faces F25b2 of the poles 25b.

The rest of the configurations of the sixth embodiment may be identical to that of the third or fourth embodiment. Accordingly, the sixth embodiment can obtain the same effects as those of the third and fourth embodiments.

Seventh Embodiment

Figure 15:
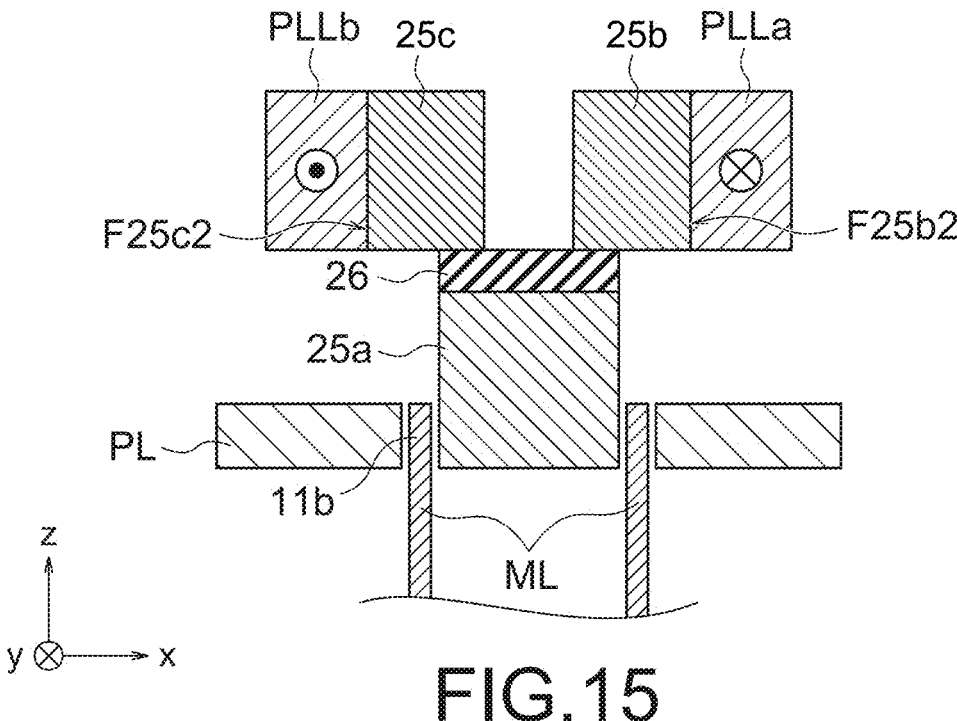
FIG. 15 is a cross-sectional view illustrating a configuration example of a magnetic memory according to a seventh embodiment.
Figure 16:
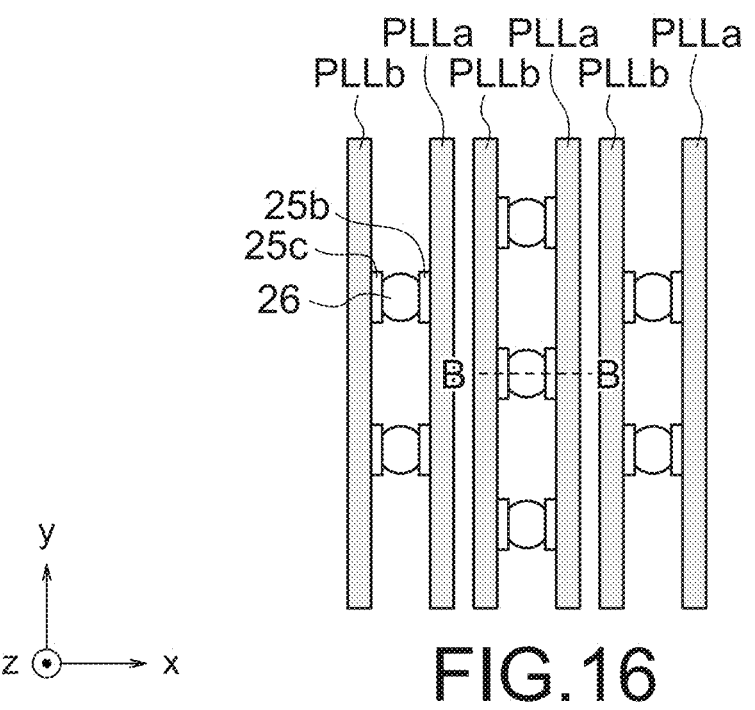
FIG. 16 is a plan view illustrating a configuration example of the magnetic memory according to the seventh embodiment.

FIG. 15 is a cross-sectional view illustrating a configuration example of a magnetic memory according to a seventh embodiment. FIG. 16 is a plan view illustrating a configuration example of the magnetic memory according to the seventh embodiment. FIG. 15 illustrates a cross-section taken along the line B-B of FIG. 16.

In the seventh embodiment, two poles 25b and 25c are provided for one pole 25a and located above the pole 25a. The pole 25c is provided adjacent to the pole 25b in the x direction.

Similarly to the plurality of poles 25b, a plurality of poles 25c are provided corresponding to the plurality of memory parts $10_{11}$ to $10_{mn}$. The poles 25c are provided corresponding to the magnetic members $ML_{11}$ to $ML_{mn}$ and located above (in the +z direction) the poles 25a. The poles 25c are electrically disconnected from their corresponding poles 25a by the insulating layers 26. The poles 25c are electrically disconnected from their adjacent poles 25b by the interlayer dielectric film (not illustrated). The shape and material of the poles 25c may be the same as the shape and material of the poles 25b. As illustrated in FIG. 16, in plan view, the poles 25b and 25c are arranged on opposite sides of each of the insulating layers 26 (or the magnetic members ML) in the x direction.

A plurality of pole lines PLLa are provided corresponding to the plurality of memory parts $10_{11}$ to $10_{mn}$. The pole lines PLLa are in contact with the side faces F25b2 of a plurality of poles 25b arranged in the y direction, where the side faces F25b2 face toward the x direction. The pole lines PLLa are provided on the side faces F25b2 of the poles 25b in the manner as described above, so that magnetization that occurs in the poles 25b when the magnetic memory passes a write current through the pole lines PLLa may be optimized.

Similarly to the plurality of pole lines PLLa, a plurality of pole lines PLLb are provided corresponding to the plurality of memory parts $10_{11}$ to $10_{mn}$. The pole lines PLLb extend in the y direction and are arranged adjacent to the pole lines PLLa. The pole lines PLLb are in contact with side faces F25c2 of a plurality of poles 25c arranged in the y direction, where the side faces F25c2 face toward the x direction. The pole lines PLLb are electrically connected to their corresponding poles 25c. On the other hand, the pole lines PLLb are electrically disconnected from the plurality of pole lines PLLa and the plurality of poles 25b. As illustrated in FIG. 16, in plan view, the pole lines PLLa and PLLb are arranged on opposite sides of each of the insulating layers 26 (or the magnetic members ML) in the x direction. The pole lines PLLa and PLLb are located on the outer sides of the poles 25b and 25c when viewed from the insulating layer 26 (or magnetic member ML). That is, the pole lines PLLa and PLLb are respectively in contact with outer faces (F25b2, F25c2) of the poles 25b and 25c facing toward such a direction as to be distanced from each other. The rest of the configurations of the seventh embodiment may be identical to that of the second embodiment.

In the manner as described above, not only the pole 25b and the pole line PLLa, but also the pole 25c and the pole line PLLb may be provided for each pole 25a. With this configuration, when passing a write current through the pole lines PLLa and PLLb, due to the SOT effect, the magnetic memory can efficiently write data into the second end portions 11b of the magnetic members ML.

During a write operation, the magnetic memory passes electric currents through the pole lines PLLa and PLLb in opposite directions to each other. For example, the magnetic memory passes an electric current through the pole line PLLa in the +y direction, and passes an electric current through the pole line PLLb in a −y direction. Accordingly, magnetization that occurs in the poles 25*b* and 25*c* is optimized.

Eighth Embodiment

Figure 17:
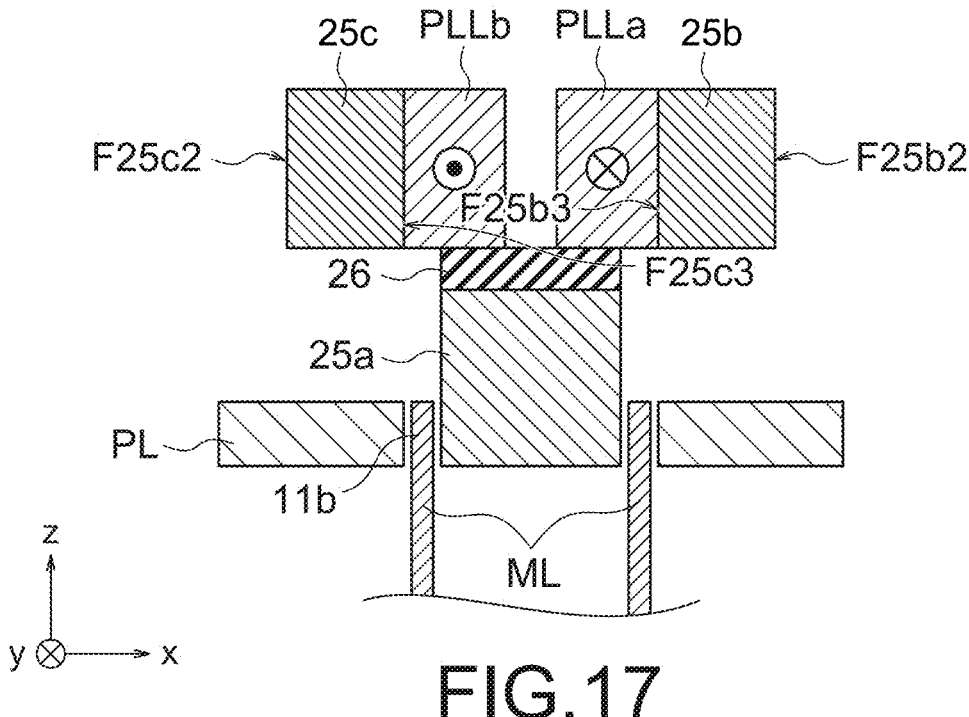
FIG. 17 is a cross-sectional view illustrating a configuration example of a magnetic memory according to an eighth embodiment.
Figure 18:
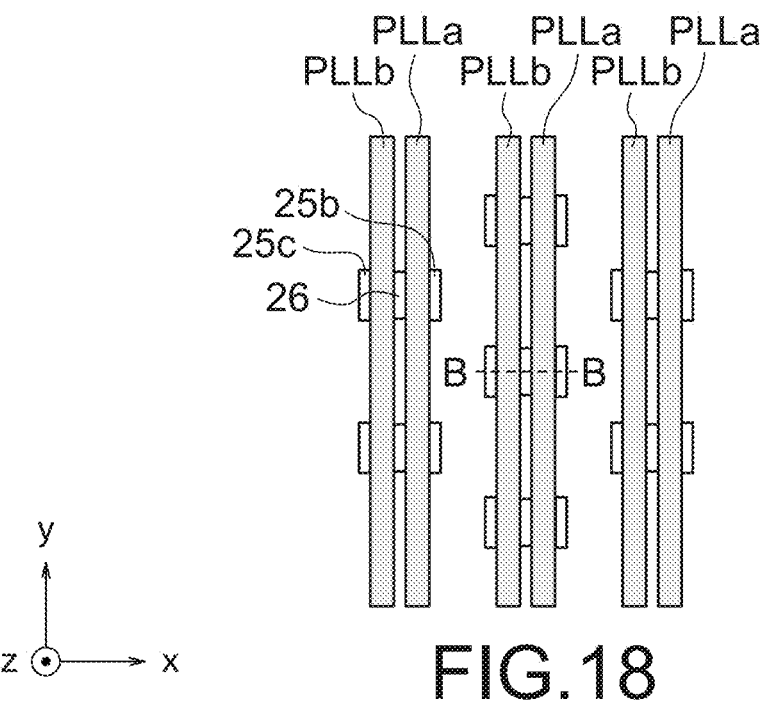
FIG. 18 is a plan view illustrating a configuration example of the magnetic memory according to the eighth embodiment.

FIG. 17 is a cross-sectional view illustrating a configuration example of a magnetic memory according to an eighth embodiment. FIG. 18 is a plan view illustrating a configuration example of the magnetic memory according to the eighth embodiment. FIG. 17 illustrates a cross-section taken along the line B-B of FIG. 18.

The eighth embodiment is identical to the seventh embodiment in that two poles 25*b* and 25*c* are provided for one pole 25*a*, and the pole lines PLLa and PLLb are provided for one pole 25*a*.

In contrast to the seventh embodiment, in the eighth embodiment, the pole lines PLLa and PLLb are located on the inner sides of the poles 25*b* and 25*c* when viewed from the insulating layer 26 (or magnetic member ML). The pole line PLLa is provided so as to come into contact with a side face F25*b*3 of the pole 25*b* on the opposite side to the side face F25*b*2. The pole line PLLb is provided so as to come into contact with a side face F25*c*3 of the pole 25*c* on the opposite side to the side face F25*c*2. That is, the pole lines PLLa and PLLb are respectively in contact with the opposed faces (F25*b*3 and F25*c*3) of the poles 25*b* and 25*c* facing each other.

The rest of the configurations of the eighth embodiment may be identical to that of the seventh embodiment. Therefore, when passing a write current through the pole lines PLLa and PLLb, due to the SOT effect, the magnetic memory can efficiently write data into the second end portions 11*b* of the magnetic members ML.

During a write operation, the magnetic memory passes electric currents through the pole lines PLLa and PLLb in opposite directions to each other. For example, the magnetic memory passes an electric current through the pole line PLLa in the +y direction, and passes an electric current through the pole line PLLb in the −y direction. Accordingly, magnetization that occurs in the poles 25*b* and 25*c* is optimized.

Ninth Embodiment

Figure 19:
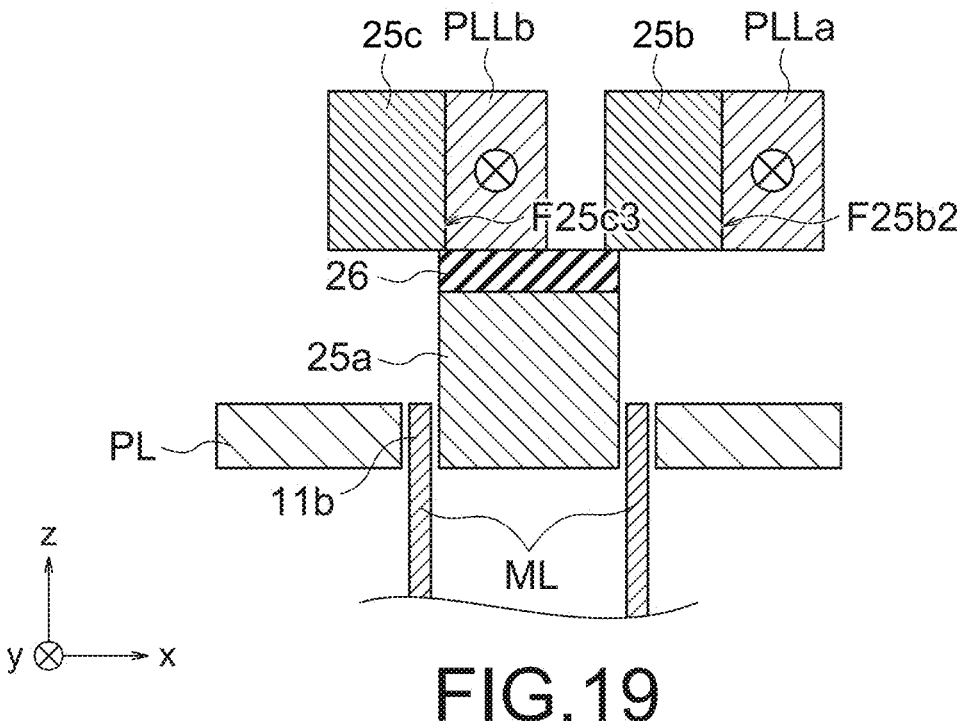
FIG. 19 is a cross-sectional view illustrating a configuration example of a magnetic memory according to a ninth embodiment.
Figure 20:
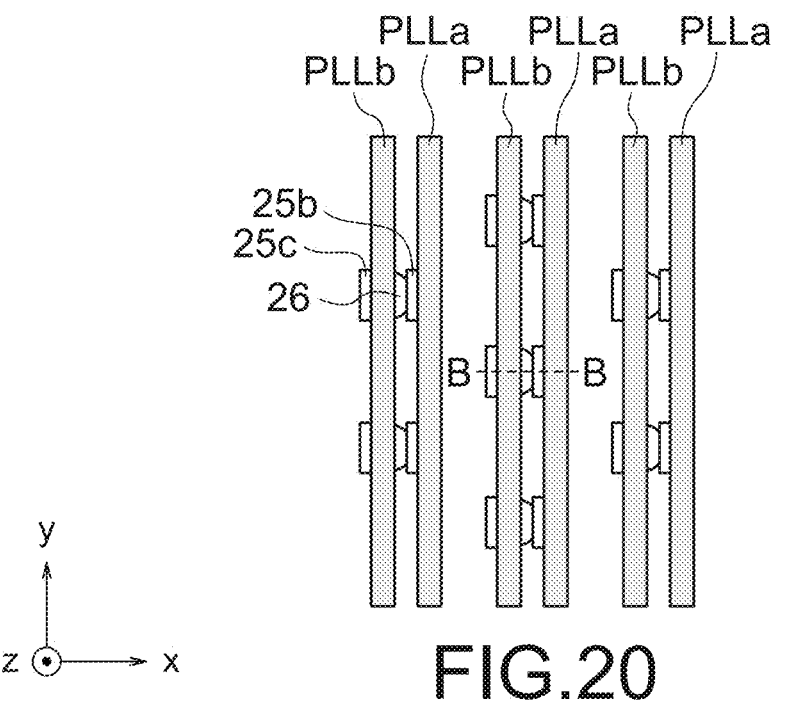
FIG. 20 is a plan view illustrating a configuration example of the magnetic memory according to the ninth embodiment.

FIG. 19 is a cross-sectional view illustrating a configuration example of a magnetic memory according to a ninth embodiment. FIG. 20 is a plan view illustrating a configuration example of the magnetic memory according to the ninth embodiment. FIG. 19 illustrates a cross-section taken along the line B-B of FIG. 20.

The ninth embodiment is identical to the seventh embodiment in that two poles 25*b* and 25*c* are provided for one pole 25*a*, and the pole lines PLLa and PLLb are provided for one pole 25*a*.

On the other hand, in the ninth embodiment, the pole lines PLLa and PLLb are arranged in the same direction with respect to the poles 25*b* and 25*c*. The pole line PLLa is provided so as to come into contact with the side face F25*b*2 of the pole 25*b*. The pole line PLLb is provided so as to come into contact with the side face F25*c*3 of the pole 25*c*. That is, the pole lines PLLa and PLLb are respectively in contact with the faces (F25*b*2 and F25*c*3) of the poles 25*b* and 25*c* facing toward the same direction.

The rest of the configurations of the ninth embodiment may be identical to that of the seventh or eighth embodiment. Therefore, when passing a write current through the pole lines PLLa and PLLb, due to the SOT effect, the magnetic memory can efficiently write data into the second end portions 11*b* of the magnetic members ML.

The magnetic memory passes electric currents through the pole lines PLLa and PLLb during a write operation both in the same direction. For example, the magnetic memory passes electric currents through the pole lines PLLa and PLLb both in the +y direction. Accordingly, magnetization that occurs in the poles 25*b* and 25*c* is optimized.

Tenth Embodiment

Figure 21:
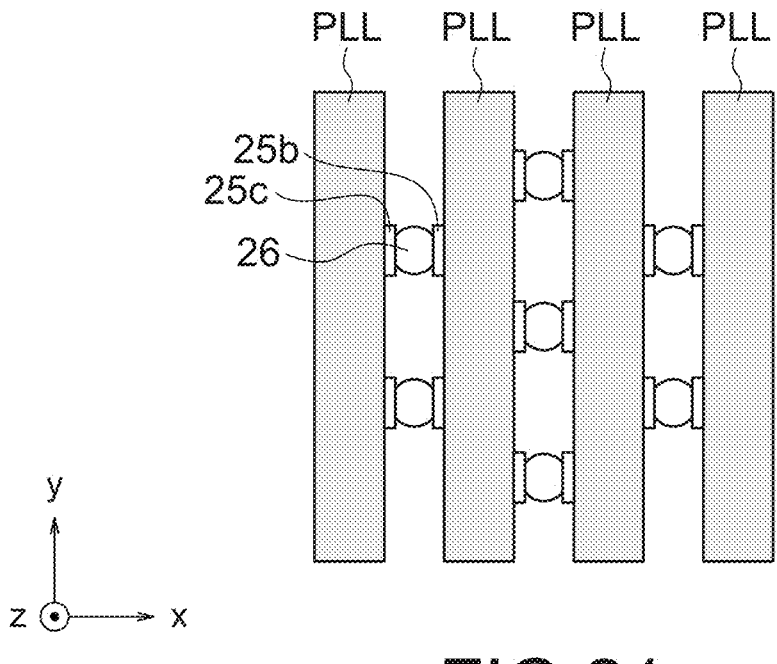
FIG. 21 is a plan view illustrating a configuration example of a magnetic memory according to a tenth embodiment.

FIG. 21 is a plan view illustrating a configuration example of a magnetic memory according to a tenth embodiment. In the tenth embodiment, the pole lines PLLa and PLLb adjacent to each other in the seventh embodiment are integrated into a single common line. Accordingly, a plurality of poles 25*c* arranged in the y direction share the pole line PLL with a plurality of poles 25*b* adjacent to the poles 25*c* in position coordinates in the x direction and arranged in the y direction.

In this case, the number of pole lines PLL is reduced to about one-half, and accordingly, the number of contacts (not illustrated) provided in the pole line PLL is also reduced to about one-half. This results in a reduction in the layout area of the magnetic memory.

Eleventh Embodiment

Figure 22:
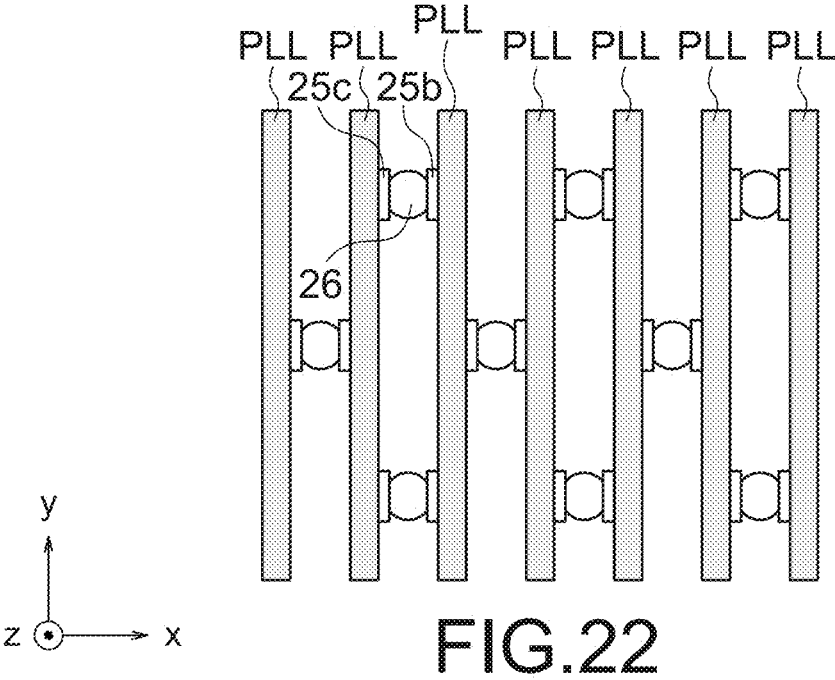
FIG. 22 is a plan view illustrating a configuration example of a magnetic memory according to an eleventh embodiment.

FIG. 22 is a plan view illustrating a configuration example of a magnetic memory according to an eleventh embodiment. The eleventh embodiment is different in arrangement of the magnetic members ML from the tenth embodiment. The plurality of magnetic members ML are similar to those in the tenth embodiment in that they are arranged in a triangular lattice pattern in plan view seen from the z direction. However, the magnetic members ML in the eleventh embodiment are arranged in a state of being rotated by about 90° on the x-y plane with respect to the arrangement of the magnetic members ML in the tenth embodiment. This depends on the positions of holes formed by an anodic oxidation treatment during formation of the magnetic members ML. In the manner as described above, the magnetic memory may have a configuration in which the arrangement of the magnetic members ML is rotated by 90°.

The rest of the configurations of the eleventh embodiment may be identical to that of the tenth embodiment. Accordingly, the eleventh embodiment can obtain the same effects as those of the tenth embodiment.

Twelfth Embodiment

Figure 23:
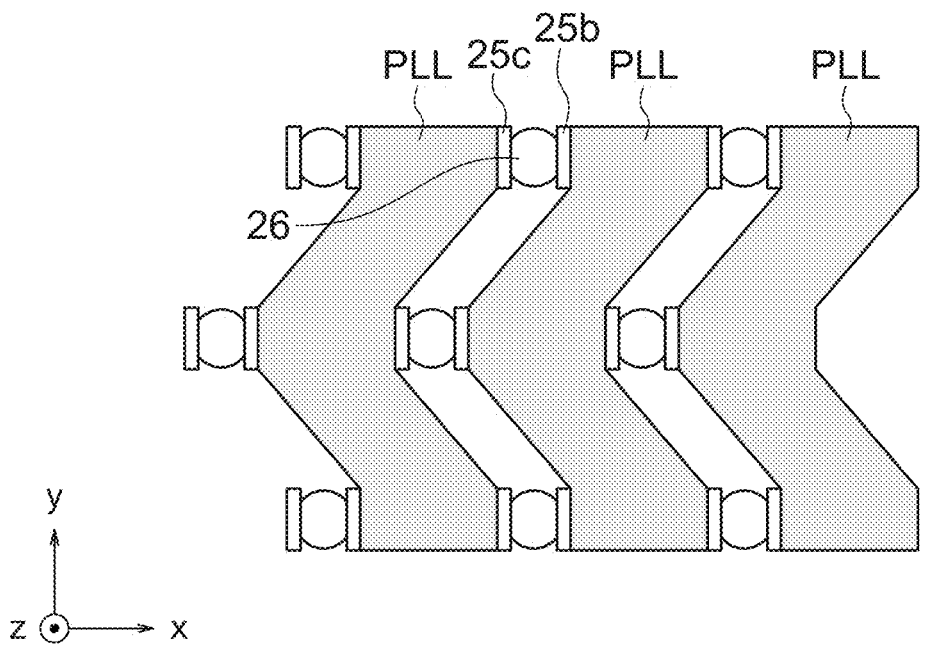
FIG. 23 is a plan view illustrating a configuration example of a magnetic memory according to a twelfth embodiment.

FIG. 23 is a plan view illustrating a configuration example of a magnetic memory according to a twelfth embodiment. Although in the tenth embodiment, the pole lines PLL are substantially straight, in the twelfth embodiment, the pole lines PLL extend in the y direction, while bending in the x direction. Although the pole lines PLL bend, the cross-section of each magnetic member ML or each insulating layer 26 is still the same as the cross-section illustrated in FIG. 15. In the twelfth embodiment, while the array of the magnetic members ML to be selected during a write operation is different from that in the tenth embodiment, the rest of the operation is the same as that in the tenth embodiment. Accordingly, the twelfth embodiment can obtain the same effects as those of the tenth embodiment.

15
Thirteenth Embodiment

Figure 24:
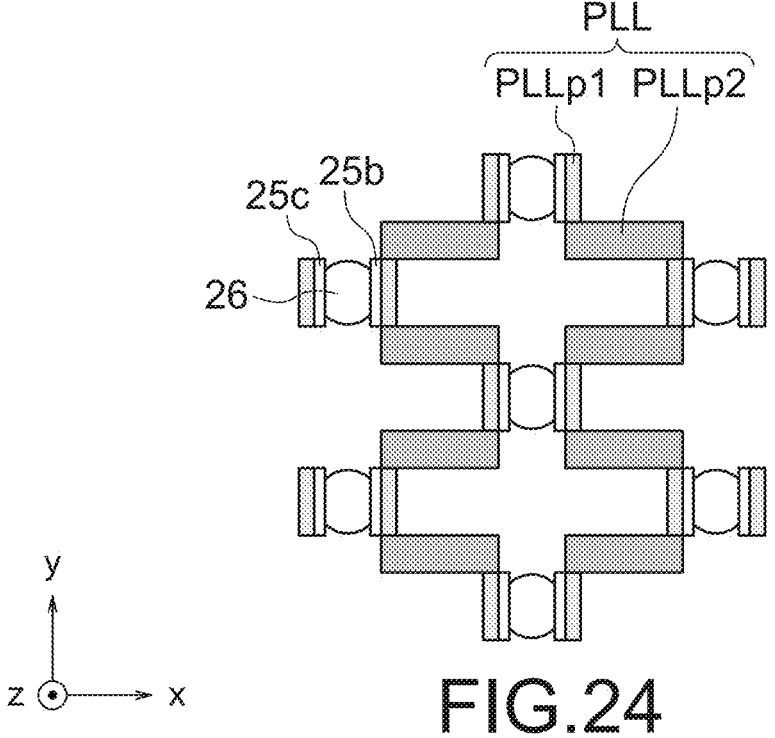
FIG. 24 is a plan view illustrating a configuration example of a magnetic memory according to a thirteenth embodiment.
Figure 25:
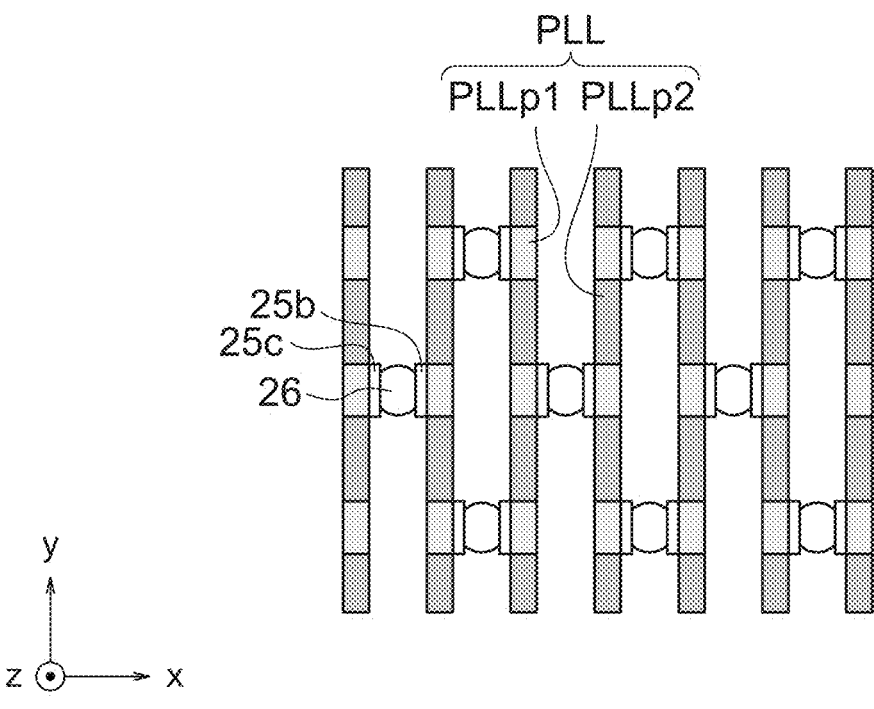
FIG. 25 is a plan view illustrating a configuration example of a magnetic memory according to a fourteenth embodiment.
Figure 26:
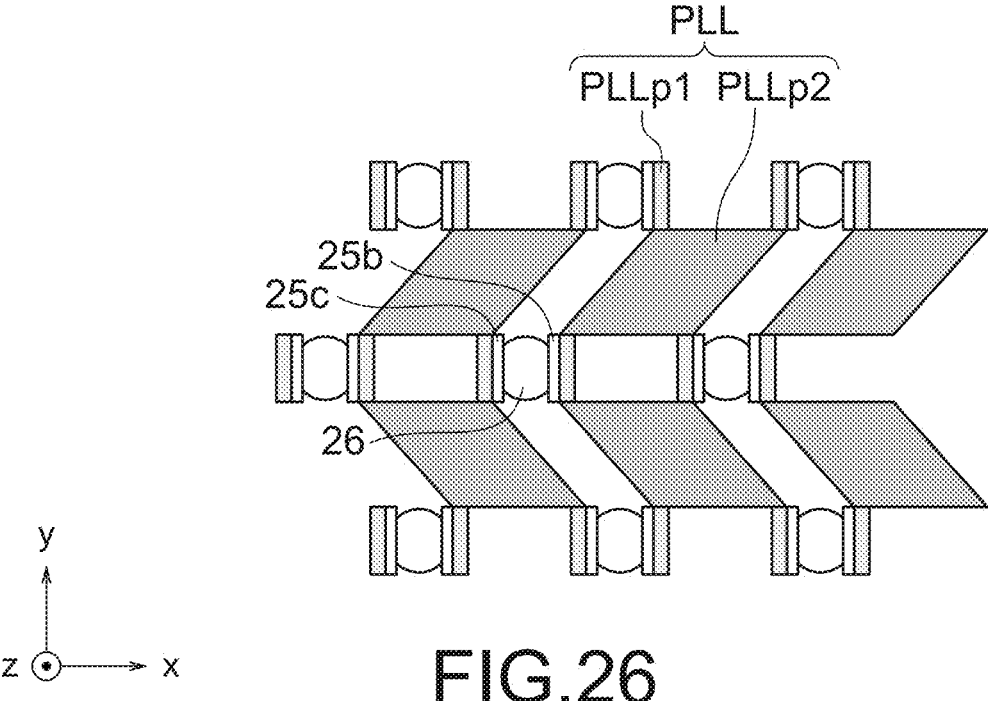
FIG. 26 is a plan view illustrating a configuration example of a magnetic memory according to a fifteenth embodiment.

FIGS. 24 to 26 are plan views illustrating a configuration example of magnetic memories according to thirteenth to fifteenth embodiments. In the thirteenth to fifteenth embodiments, each of the pole lines PLL is formed of a first wire portion PLLp1 and a second wire portion PLLp2. The first wire portion PLLp1 is in contact with the pole 25*a* or the pole 25*b*. Accordingly, similarly to the pole lines PLL in the above embodiments, materials selected in consideration of the SOT effect (for example, W, Ta, Pt, Pd, Hf, Ir, Re, Ag, Au, Bi, Sb, Se, Te, and Mo), or alloys or compounds containing any of these materials are used for the first wire portion PLLp1. Materials (for example, W, Cu, and Pt) having a lower specific resistance are used for the second wire portion PLLp2 compared to the first wire portion PLLp1 in order to reduce the wire resistance to a minimum. In the manner as described above, the pole line PLL is divided into and formed of the first wire portion PLLp1 and the second wire portion PLLp2, so that the pole line PLL can efficiently write data into the second end portion 11*b* of the magnetic member ML by using the SOT effect, and can also reduce power consumption of the magnetic memory.

In the thirteenth embodiment in FIG. 24, the second wire portions PLLp2 electrically connect a plurality of first wire portions PLLp1 arranged in a staggered pattern. Each of the second wire portions PLLp2 extends between the plurality of first wire portions PLLp1 in the x direction substantially perpendicular to the direction in which the pole line PLL extends.

In the fourteenth embodiment in FIG. 25, the second wire portions PLLp2 electrically connect a plurality of first wire portions PLLp1 arranged substantially linearly. Each of the second wire portions PLLp2 extends between the plurality of first wire portions PLLp1 in the direction in which the pole lines PLL extend (y direction).

In the fifteenth embodiment in FIG. 26, the second wire portions PLLp2 electrically connect a plurality of first wire portions PLLp1 arranged in a staggered pattern. Further, each of the second wire portions PLLp2 is shared between a plurality of the first wire portions PLLp1 adjacent to each other in position coordinates in the x direction. Accordingly, the second wire portion PLLp2 is formed in, for example, a substantially parallelogram in plan view.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a plurality of first magnetic members extending in a first direction, each of which is cylindrical and has a first end portion and a second end portion;
a plurality of second magnetic members provided corresponding to the first magnetic members, and extending in the first direction from an inside of cylinders of the first magnetic members on a side of the second end portions;
a plurality of third magnetic members provided above the second magnetic members corresponding to the first magnetic members, and electrically disconnected from the second magnetic members;
a plurality of first wires extending in a second direction intersecting the first direction, arranged adjacent to each other in a third direction intersecting the first direction and the second direction, and electrically connected to the third magnetic members arranged in the second direction;
a fourth magnetic member provided around the second end portions of the first magnetic members, and electrically disconnected from the third magnetic members; and
a plurality of second wires provided on a side of the first end portions of the first magnetic members.

2. The memory of claim 1, wherein the first wires are in contact with first faces of the third magnetic members, the first faces facing toward the first direction.

3. The memory of claim 1, wherein the first wires are in contact with second faces of the third magnetic members, the second faces facing toward the third direction.

4. The memory of claim 1, wherein the first wires are in contact with both first faces and second faces of the third magnetic members, the first faces facing toward the first direction, the second faces facing toward the third direction.

5. The memory of claim 4, wherein first portions of the first wires located on the first faces of the third magnetic members, and second portions of the first wires located on the second faces of the third magnetic members are electrically connected to each other.

6. The memory of claim 1, wherein the fourth magnetic member is electrically connected in common to the second end portions of the first magnetic members.

7. The memory of claim 1, further comprising a conductive member provided in a position being more distanced from the first magnetic members in the first direction than the second to fourth magnetic members and the first wires, and electrically connected to the fourth magnetic member.

8. The memory of claim 7, further comprising a contact configured to electrically connect the fourth magnetic member and the conductive member.

9. The memory of claim 7, wherein the conductive member has a lower resistance than the fourth magnetic member.

10. The memory of claim 7, wherein the conductive member includes a fifth magnetic member.

11. The memory of claim 1, wherein the second magnetic members have a substantially columnar shape.

12. The memory of claim 11, wherein the third magnetic members have a substantially cuboid shape.

13. The memory of claim 12, wherein the third magnetic members are located inside the second magnetic members in plan view seen from the first direction.

14. The memory of claim 1, further comprising an insulating layer provided between the second magnetic members and the third magnetic members.

15. The memory of claim 1, wherein the second wires extend in the third direction.

16. The memory of claim 1, further comprising a plurality of magnetoresistive elements provided between the second wires and the first end portions of the first magnetic members.

17. The memory of claim 16, further comprising a plurality of switching elements provided between the magnetoresistive elements and the second wires.

18. The memory of claim 1, further comprising:
a plurality of sixth magnetic members provided above the second magnetic members corresponding to the first magnetic members, and electrically disconnected from the second magnetic members and the third magnetic members; and a plurality of third wires extending in the second direction and located adjacent to the first wires in the third direction, the third wires being electrically connected to the sixth magnetic members arranged in the second direction, the third wires being electrically disconnected from the second magnetic members and the third magnetic members.

19. The memory of claim 18, wherein the third wires are in contact with third faces of the sixth magnetic members, the third faces facing toward the third direction.

20. The memory of claim 19, wherein the first wires are in contact with second faces of the third magnetic members, the second faces facing toward the third direction, and the third magnetic members and the sixth magnetic members are provided between the first wires and the third wires.

21. The memory of claim 20, wherein a first electric current flows through each of the first wires and a second electric current flows through each of the third wires, the first and the second electric current flowing in opposite directions to each other.

22. The memory of claim 19, wherein the first wires are in contact with second faces of the third magnetic members, the second faces facing toward the third direction, and portions of the first wires and portions of the third wires are provided between the third magnetic members and the sixth magnetic members.

23. The memory of claim 22, wherein a first electric current flows through each of the first wires and a second electric current flows through each of the third wires, the first and the second electric current flowing in opposite directions to each other.

24. The memory of claim 19, wherein the first wires are in contact with second faces of the third magnetic members, the second faces facing toward the third direction, the second faces and the third faces facing toward a same direction.

25. The memory of claim 24, wherein a first electric current flow through each of the first wires and a second electric current flows through the third wires, the first and the second electric current flowing in a same direction.

26. The memory of claim 1, further comprising a plurality of sixth magnetic members provided above the second magnetic members corresponding to the first magnetic members, and electrically disconnected from the second magnetic members and the third magnetic members, wherein the first wires are in contact with second faces of the third magnetic members and are in contact with third faces of the sixth magnetic members, the second faces facing toward the third direction, the third faces facing toward the third direction, and the sixth magnetic members arranged in the second direction share one of the first wires with the third magnetic members adjacent to the sixth magnetic members in position of the third direction and arranged in the second direction.

27. The memory of claim 26, wherein the first wires extend in the second direction, while bending in the third direction.

28. The memory of claim 26, wherein each of the first wires includes a plurality of first wire portions in contact with the third or sixth magnetic members, and second wire portions provided between the first wire portions adjacent to each other and having a lower resistance than the first wire portions.

29. The memory of claim 1, wherein each of the first wires includes a plurality of first wire portions in contact with the third magnetic members, and second wire portions provided between the first wire portions adjacent to each other and having a lower resistance than the first wire portions.

* * * * *